(12) United States Patent
Nakashima et al.

(10) Patent No.: US 11,063,025 B2
(45) Date of Patent: Jul. 13, 2021

(54) SEMICONDUCTOR MODULE AND POWER CONVERSION DEVICE

(71) Applicant: Mitsubishi Electric Corporation, Chiyoda-ku (JP)

(72) Inventors: Junichi Nakashima, Chiyoda-ku (JP); Shota Morisaki, Chiyoda-ku (JP); Yoshiko Tamada, Chiyoda-ku (JP); Yasushi Nakayama, Chiyoda-ku (JP); Tetsu Negishi, Chiyoda-ku (JP); Ryo Tsuda, Chiyoda-ku (JP); Yukimasa Hayashida, Fukuoka (JP); Ryutaro Date, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/632,029

(22) PCT Filed: Aug. 27, 2018

(86) PCT No.: PCT/JP2018/031521
§ 371 (c)(1),
(2) Date: Jan. 17, 2020

(87) PCT Pub. No.: WO2019/044748
PCT Pub. Date: Mar. 7, 2019

(65) Prior Publication Data
US 2020/0185359 A1    Jun. 11, 2020

(30) Foreign Application Priority Data
Sep. 4, 2017  (JP) .............................. JP2017-169446

(51) Int. Cl.
*H01L 25/07* (2006.01)
*H01L 23/00* (2006.01)
*H02P 27/06* (2006.01)

(52) U.S. Cl.
CPC ............ *H01L 25/072* (2013.01); *H01L 24/48* (2013.01); *H01L 2224/48227* (2013.01);
(Continued)

(58) Field of Classification Search
CPC ................... H01L 25/072; H01L 24/48; H01L 2224/48227; H01L 2924/14252; H01L 2924/30107
See application file for complete search history.

(56) References Cited

U.S. PATENT DOCUMENTS 6,147,368 A    11/2000  Kon et al.
6,281,569 B1    8/2001  Sugyama
(Continued)

FOREIGN PATENT DOCUMENTS

JP    11-87713 A    3/1999
JP    11-97462 A    4/1999
(Continued)

OTHER PUBLICATIONS

International Search Report dated Oct. 9, 2018 in PCT/JP2018/031521 filed Aug. 27, 2018, 2 pages.

*Primary Examiner* — Marc Anthony Armand
(74) *Attorney, Agent, or Firm* — Xsensus LLP

(57) ABSTRACT

Gates of a plurality of semiconductor switching elements are electrically connected to a common gate control pattern by gate wires. Sources of the plurality of semiconductor switching elements are electrically connected to a common source control pattern by source wires. The gate control pattern is disposed to interpose the source control pattern between the gate control pattern and each of the plurality of semiconductor switching elements that are connected in parallel and that operate in parallel. Hence, each of the gate wires becomes longer than each of the source wires, and has an inductance larger than the source wire. Accordingly, gate
(Continued)

oscillation is reduced or suppressed in the plurality of semiconductor switching elements that are connected in parallel and that operate in parallel.

20 Claims, 18 Drawing Sheets

(52) U.S. Cl.
CPC ............... *H01L 2924/14252* (2013.01); *H01L 2924/30107* (2013.01); *H02P 27/06* (2013.01)

(56) References Cited

U.S. PATENT DOCUMENTS

| | | |
|---|---|---|
| 2002/0024134 A1 | 2/2002 | Arai et al. |
| 2002/0024135 A1 | 2/2002 | Arai et al. |
| 2006/0261473 A1* | 11/2006 | Connah .................. H01L 23/15 |
| | | 257/728 |
| 2011/0049580 A1* | 3/2011 | Lui ........................ H01L 25/50 |
| | | 257/262 |
| 2013/0001805 A1 | 1/2013 | Azuma et al. |
| 2014/0124915 A1 | 5/2014 | Hayashi et al. |

FOREIGN PATENT DOCUMENTS

| | | |
|---|---|---|
| JP | 2000209846 A | 7/2000 |
| JP | 2001-185679 A | 7/2001 |
| JP | 2002-153079 A | 5/2002 |
| JP | 2005-129826 A | 5/2005 |
| JP | 4138192 B2 | 8/2008 |
| JP | 4484400 B2 | 6/2010 |
| JP | 2013-12560 A | 1/2013 |
| WO | WO 2013/002249 A1 | 1/2013 |

* cited by examiner

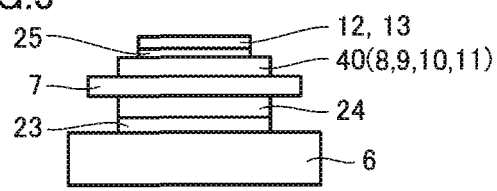
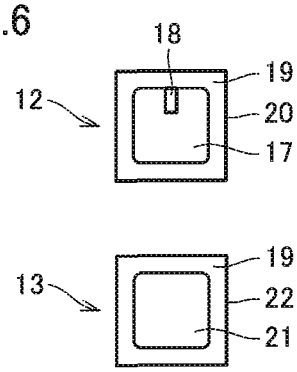
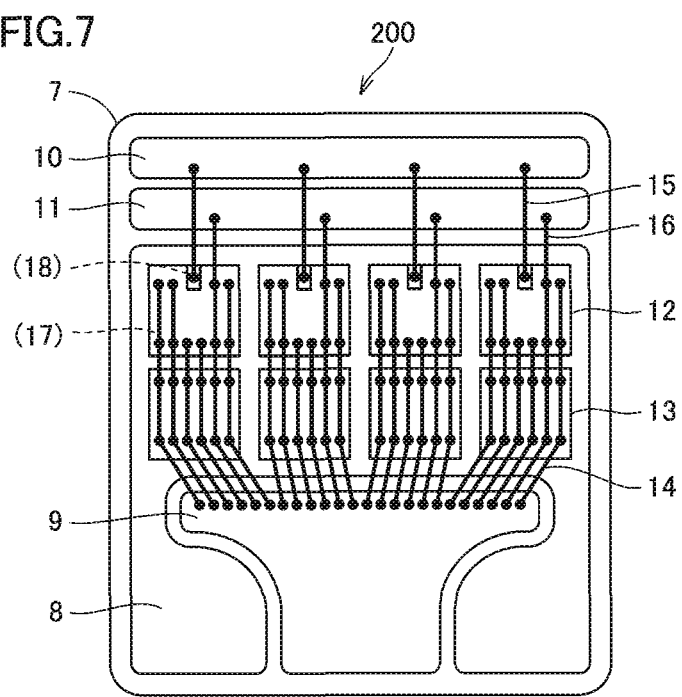

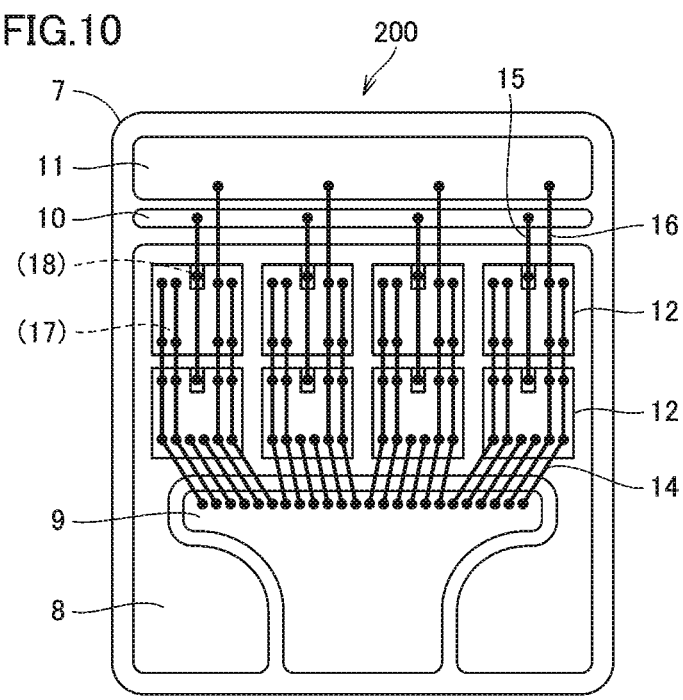
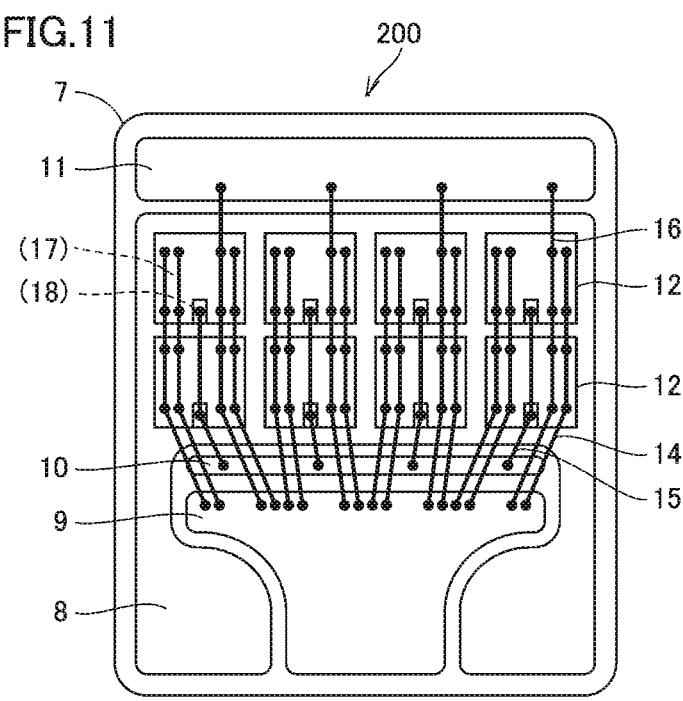

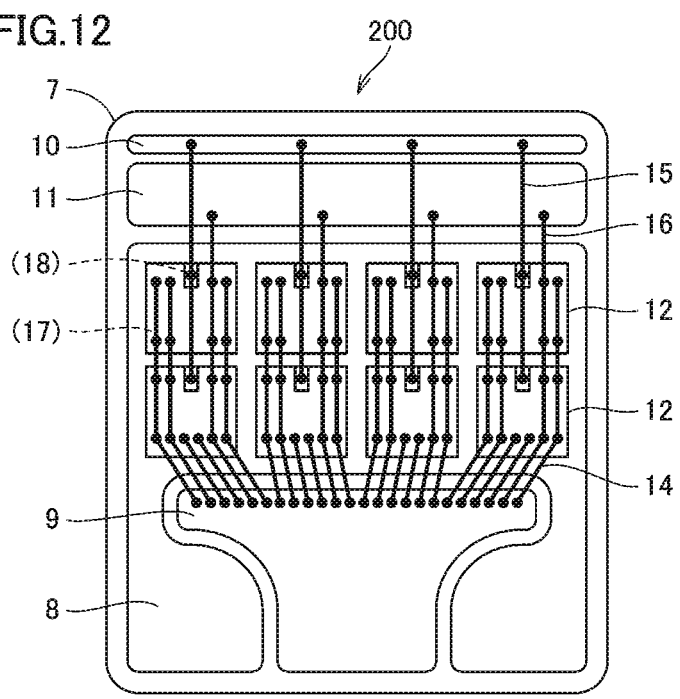
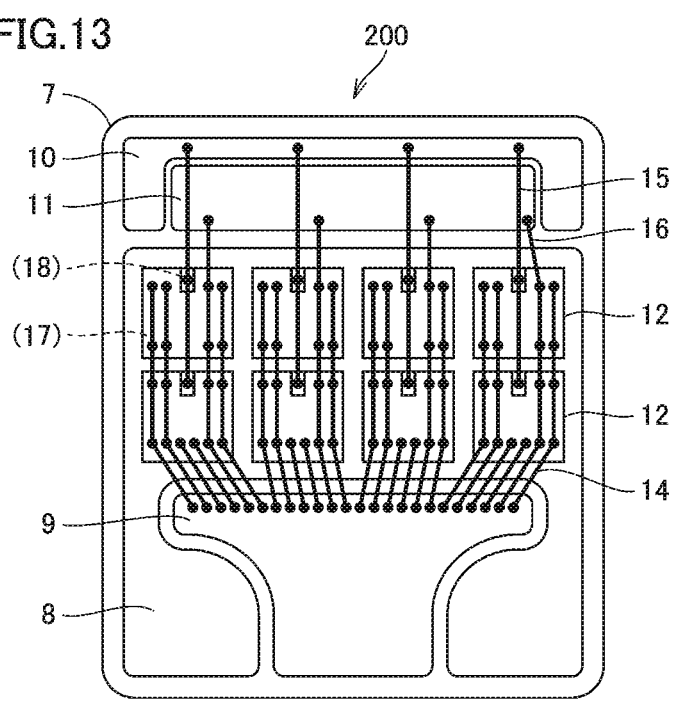

SEMICONDUCTOR MODULE AND POWER CONVERSION DEVICE

TECHNICAL FIELD

The present invention relates to a semiconductor module and a power conversion device, more particularly, a power semiconductor module including a plurality of semiconductor switching elements that operate in parallel, and a power conversion device including the semiconductor module.

BACKGROUND ART

In an insulation type power semiconductor module used for a power conversion device such as an inverter or a converter, the following technique is applied to handle a large amount of current: a plurality of semiconductor switching elements are mounted in the same module and are operated in parallel.

On the other hand, in such a configuration, even when the plurality of semiconductor switching elements that operate in parallel have characteristics comparable to each other, switching characteristics can be varied due to a variation in wiring in the module when operating the plurality of semiconductor elements in parallel.

Moreover, when the number of the semiconductor switching elements that operate in parallel is increased, a parasitic inductance between the plurality of semiconductor elements that operate in parallel is increased due to an increased element-disposed area, complicated wiring, or the like.

Due to such an operation variation between the semiconductor switching elements that operate in parallel and the increased parasitic inductance between the elements, a phenomenon called "gate oscillation" may occur. In the gate oscillation, voltage and current of each semiconductor switching element are oscillated with positive feedback amplification resulting from potential oscillation of a control electrode (gate) due to the parasitic capacitance of each semiconductor switching element and the parasitic inductance between the elements. The gate oscillation may cause not only deterioration, destruction, or the like of each semiconductor element but also noise radiated to outside the module, noise conducted to an external circuit, or the like.

In order to suppress such gate oscillation, Patent Literature 1 (Japanese Patent Laying-Open No. 2005-129826) describes a configuration in which a resistance element is connected to a gate wire of a semiconductor element in series. Similarly, Patent Literature 2 (Japanese Patent No. 4138192) describes a configuration in which a high-frequency loss element is connected to a gate wire in series.

On the other hand, in order to reduce the variation in switching characteristics that causes the gate oscillation, Patent Literature 3 (Japanese Patent Laying-Open No. 2000-209846) describes a configuration in which current unbalance between a plurality of semiconductor elements connected in parallel is reduced by adjusting inductance and resistance of an emitter wire of each of the elements. Moreover, Patent Literature 4 (Japanese Patent No. 4484400) describes the following configuration: in order to attain a uniform reference potential between a plurality of semiconductor elements, emitter electrodes formed on semiconductor chips of a plurality of switching elements are connected to each other, using a conductor not affected by main current, at a position at which they are close to each other as much as possible.

CITATION LIST

Patent Literature

PTL 1: Japanese Patent Laying-Open No. 2005-129826
PTL 2: Japanese Patent No. 4138192
PTL 3: Japanese Patent Laying-Open No. 2000-209846
PTL 4: Japanese Patent No. 4484400

SUMMARY OF INVENTION

Technical Problem

In each of Patent Literature 1 and Patent Literature 2, the gate oscillation is suppressed by reducing a speed in turning on/off the semiconductor switching element. However, in Patent Literature 1, since the gate oscillation is reduced using only the gate resistor, there is a tradeoff between the gate resistance and the gate oscillation. Specifically, by providing a large gate resistance, the oscillation is reduced but the switching speed also becomes slow, with the result that power loss is increased, disadvantageously.

Meanwhile, in Patent Literature 2, the gate oscillation is reduced using a magnetic substance such as ferrite; however, in the power semiconductor module that operates at a high temperature, as the temperature becomes higher, the oscillation reduction effect is decreased more in relation with the Curie temperature of the magnetic substance, disadvantageously. Moreover, since it is necessary to mount the high-frequency loss element inside the module, problems arise in terms of reliability of the high-frequency loss element when mounted as well as an increase in the number of components.

According to the configuration of Patent Literature 3, respective amounts of current among the semiconductor switching elements are made uniform by adding inductance by way of a bypass portion, but inductances between the semiconductor switching elements are increased. Therefore, the gate oscillation may be likely to occur due to parasitic capacitances of the semiconductor switching elements and inductances between the elements.

Further, Patent Literature 4 describes that even when a load is short-circuited, the oscillation phenomenon of the gate potential can be suppressed due to uniform emitter potentials of IGBTs (Insulated Gate Bipolar Transistors). In order to attain this, the following configuration is applied: for suppression of current, an emitter control electrode is provided at the pattern side at which main current flows so as to raise an emitter potential by way of voltage drop that occurs when short-circuit current flows. However, since the current suppression effect provided by this configuration occurs also during a normal operation, it is concerned that the switching speed is decreased to increase power loss.

The present invention has been made to solve such problems, and has an object to reduce or suppress gate oscillation without increasing power loss in a semiconductor module having a plurality of semiconductor switching elements that are connected in parallel and that operate in parallel.

Solution to Problem

In a certain aspect of the present invention, a semiconductor module having a plurality of semiconductor switching elements that operate in parallel includes: an insulating substrate on which the plurality of semiconductor switching elements are mounted; and first and second wires. On the insulating substrate, a main electrode control pattern and a control electrode control pattern are provided to be common to the plurality of semiconductor switching elements. Each of the main electrode control pattern and the control electrode control pattern is electrically connected to a drive circuit for the plurality of semiconductor switching elements. On the insulating substrate, respective main electrode pads and respective control electrode pads are provided to correspond to the plurality of semiconductor switching elements. The main electrode pads are electrically connected to main electrodes of the semiconductor switching elements. The control electrode pads are electrically connected to control electrodes of the semiconductor switching elements. The first wires electrically connect the respective main electrode pads of the semiconductor switching elements to the main electrode control pattern. The second wires electrically connect the respective control electrode pads of the semiconductor switching elements to the control electrode control pattern. A wiring inductance of a second path formed to extend through the second wires and the control electrode control pattern between the control electrode pads of the plurality of semiconductor switching elements is larger than a wiring inductance of a first path formed to extend through the first wires and the main electrode control pattern between the main electrode pads of the plurality of semiconductor switching elements.

Advantageous Effects of Invention

According to the present invention, the wiring inductance between the control electrode pads is larger than the wiring inductance between the main electrode pads in the semiconductor module having the plurality of semiconductor switching elements that are connected in parallel and that operate in parallel. Therefore, the gate oscillation is reduced or suppressed without increasing power loss in the plurality of semiconductor switching elements that are connected in parallel and that operate in parallel.

BRIEF DESCRIPTION OF DRAWINGS

FIG. 5 is a cross sectional view schematically showing a portion of a cross section of the power semiconductor module shown in FIG. 3.

FIG. 6 is a schematic top view of semiconductor elements (a semiconductor switching element and a reflux diode) shown in FIG. 3.

FIG. 7 is a schematic top view of an element-mounted substrate on which the power semiconductor module shown in FIG. 3 is mounted.

FIG. 10 is a schematic top view of an element-mounted substrate for illustrating a first exemplary configuration of a power semiconductor module according to a second embodiment.

FIG. 11 is a schematic top view of an element-mounted substrate for illustrating a second exemplary configuration of the power semiconductor module according to the second embodiment.

FIG. 12 is a schematic top view of an element-mounted substrate for illustrating a third exemplary configuration of the power semiconductor module according to the second embodiment.

FIG. 13 is a schematic top view of an element-mounted substrate for illustrating a fourth exemplary configuration of the power semiconductor module according to the second embodiment.

DESCRIPTION OF EMBODIMENTS

Figure 1:
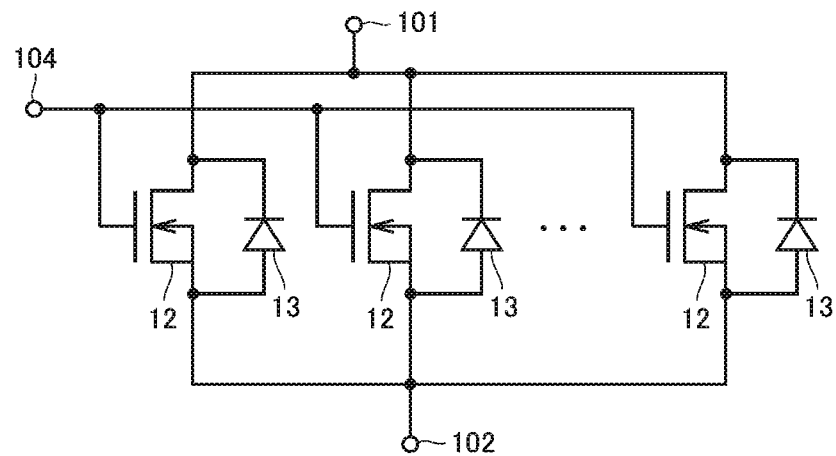
FIG. 1 is a schematic electric circuit diagram illustrating a first exemplary configuration of a power semiconductor module according to a first embodiment.

The following describes embodiments of the present invention in detail with reference to figures. It should be noted that in the description below, the same or corresponding portions in the figures are given the same reference characters and will not be described repeatedly in principle.

First Embodiment

Figure 2:
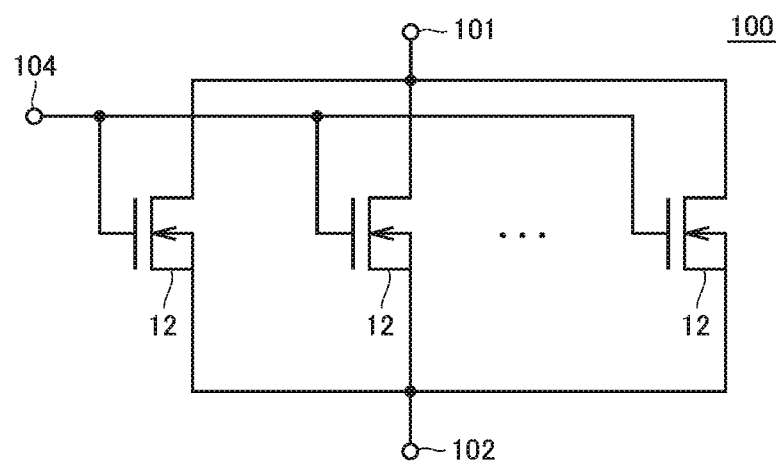
FIG. 2 is a schematic electric circuit diagram illustrating a second exemplary configuration of the power semiconductor module according to the first embodiment.

Each of FIG. 1 and FIG. 2 is a schematic electric circuit diagram illustrating a first exemplary configuration of a power semiconductor module 100 according to a first embodiment.

With reference to FIG. 1, power semiconductor module 100 according to the first embodiment has a plurality of semiconductor switching elements 12 connected in parallel. Each of semiconductor switching elements 12 is a self-turn off semiconductor switching element, and is representatively constituted of a MOSFET (Metal Oxide Semiconductor Field Effect Transistor). In the description below, it is assumed that semiconductor switching element 12 is a MOSFET, and has a source and a drain each serving as a main electrode and a gate serving as a control electrode. Power semiconductor module 100 is applicable to a power conversion device such as an inverter or a converter.

The respective drains of semiconductor switching elements 12 are electrically connected to a common electrode 101, and the respective sources of semiconductor switching elements 12 are electrically connected to a common electrode 102. Further, the respective gates of semiconductor switching elements 12 are electrically connected to a common electrode 104. As a result, in power semiconductor module 100, the plurality of semiconductor switching elements 12 are connected in parallel between electrodes 101 and 102, and operate in parallel in accordance with a potential of electrode 104. With the parallel operation, a large amount of current can be handled in power semiconductor module 100.

It should be noted that in the exemplary configuration of FIG. 1, a reflux diode 13 is connected to each semiconductor switching element 12 in anti-parallel. Alternatively, as in the exemplary configuration of FIG. 2, reflux diode 13 can be omitted. For example, when a reflux path equivalent to a reflux path formed by reflux diode 13 can be formed by a diode or SBD (Schottky Barrier Diode) included in semiconductor switching element 12, power semiconductor module 100 can be formed without providing reflux diode 13.

It should be noted that each of semiconductor switching element 12 and reflux diode 13 is constituted of a wide band gap semiconductor. The wide band gap semiconductor is any one of silicon carbide (SiC), gallium nitride (GaN), gallium oxide ($Ga_2O_3$) and diamond (C), for example.

The wide band gap semiconductor has more excellent breakdown voltage than that of a conventional silicon semiconductor. Therefore, by using the wide band gap semiconductor to form each of semiconductor switching element 12 and reflux diode 13, each of semiconductor switching element 12 and reflux diode 13 can control voltage comparable to the voltage controlled by the conventional silicon-based semiconductor element while the thickness thereof is less than or equal to the half of the thickness of the conventional silicon-based semiconductor element. As a result, a chip for each of semiconductor switching element 12 and reflux diode 13 can be small. Moreover, with such a thickness thinner than the thickness of the conventional silicon-based semiconductor element, resistance is reduced, whereby loss can be reduced.

It should be noted that the number of semiconductor switching elements 12 (and reflux diodes 13) connected in parallel in each of the below-described embodiments including the first embodiment is exemplary. A below-described structure is similarly applicable to a power semiconductor module 100 in which any number of semiconductor switching elements 12 (and reflux diodes 13) are connected in parallel.

Figure 3:
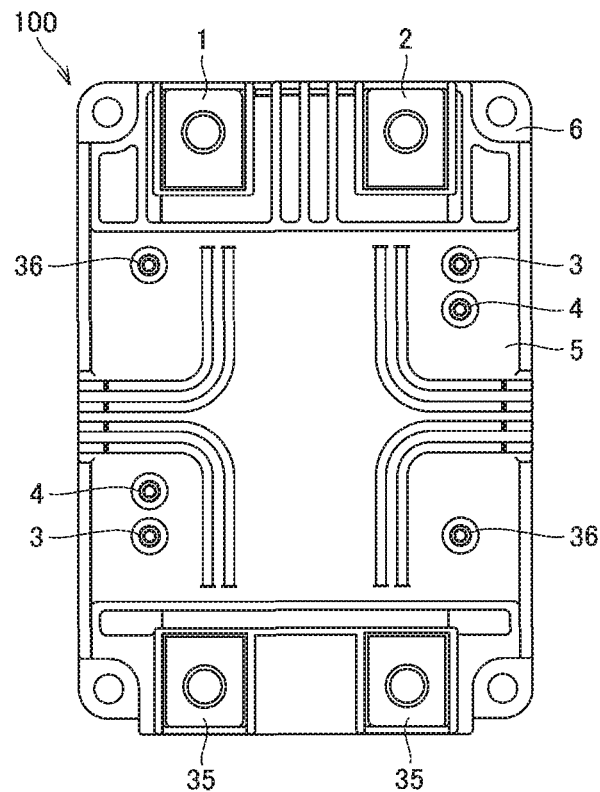
FIG. 3 is a schematic top view of the power semiconductor module according to the first embodiment.
Figure 4:
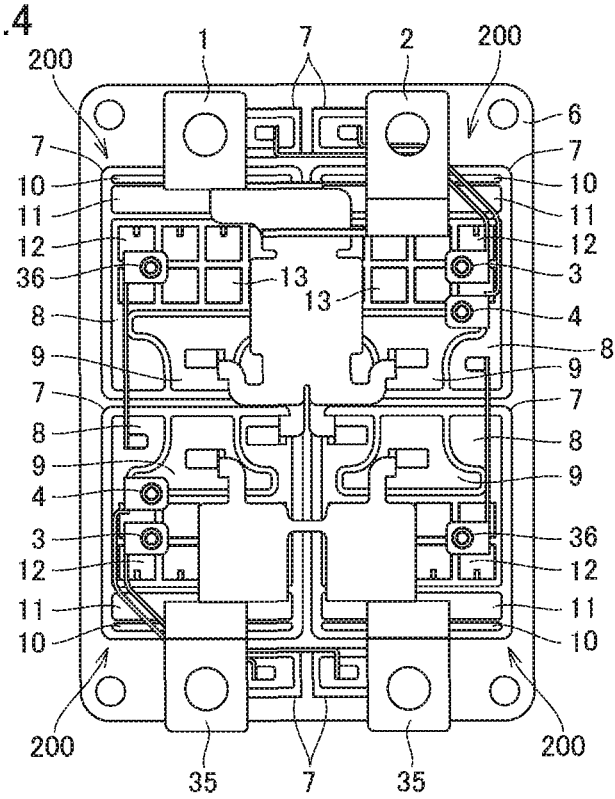
FIG. 4 is a schematic top view schematically showing inside of the power semiconductor module shown in FIG. 3.

Next, the following describes the structure of power semiconductor module 100 according to the first embodiment with reference to FIG. 3 to FIG. 7. It should be noted that each of FIG. 3 and FIG. 4 shows an example in which power semiconductor module 100 is formed using four element-mounted substrates 200. Since respective configurations of element-mounted substrates 200 are the same, a configuration of one element-mounted substrate 200 will be described below.

FIG. 3 is a schematic top view of power semiconductor module 100 according to the first embodiment. FIG. 4 is a schematic top view schematically showing inside of power semiconductor module 100 shown in FIG. 3. FIG. 5 is a cross sectional view schematically showing a portion of a cross section of the power semiconductor module shown in FIG. 3. FIG. 6 is a schematic top view of the semiconductor elements (semiconductor switching element 12 and reflux diode 13) shown in FIG. 3. FIG. 7 is a schematic top view of element-mounted substrate 200 of power semiconductor module 100 shown in FIG. 3.

With reference to FIG. 3, power semiconductor module 100 includes a drain electrode 1, a source electrode 2, source control electrodes 3, gate control electrodes 4, a housing 5, a base plate 6, output electrodes 35, and drain sense electrodes 36. Each of gate control electrodes 4 corresponds to electrode 104 of FIG. 1. Each of drain electrode 1, source electrode 2, and output electrodes 35 corresponds to electrode 101 or 102 of FIG. 1.

Base plate 6 is a metal radiator for radiating, to outside, heat generated inside power semiconductor module 100. Each of drain electrode 1, source electrode 2, and output electrodes 35 is exposed to outside of housing 5, and is capable of making electric contact with the outside of power semiconductor module 100. For example, each of these electrodes is electrically connected to a bus bar of a power conversion device or the like.

With reference to FIG. 4, power semiconductor module 100 further includes insulating substrates 7, and further includes drain patterns 8, source patterns 9, gate control patterns 10, and source control patterns 11, which are formed on respective insulating substrates 7. Each of insulating substrates 7 is representatively composed of a ceramic, but may be formed using an insulating layer portion of a metal substrate having a resin insulating layer.

With reference to FIG. 5, a wiring pattern 40 is joined to a front surface (upper portion in FIG. 6) of insulating substrate 7 by way of brazing or the like. This wiring pattern 40 includes drain pattern 8, source pattern 9, gate control pattern 10, and source control pattern 11 described above. A wiring pattern (hereinafter, also referred to as "backside surface pattern") 24 is joined to a backside surface (lower portion in FIG. 6) of insulating substrate 7 in a manner similar to that at the front surface side.

Insulating substrate 7 is joined to base plate 6 at the backside surface pattern 24 side using a joining material 23. Further, at the front surface side of insulating substrate 7, semiconductor switching element 12 and reflux diode 13 also shown in FIG. 1 and FIG. 2 are joined onto wiring pattern 40 using a joining material 25. It should be noted that a solder, a silver paste material, or a copper paste material can be used for each of joining materials 23, 25. By mounting the wiring patterns and the semiconductor elements (which collectively represent semiconductor switching element 12, reflux diode 13 and the like) on insulating substrate 7 in this way, element mounted substrate 200 is formed.

With reference to FIG. 6, at a drain pad 20 formed at the element backside surface side, semiconductor switching element 12 is joined to drain pattern 8 formed on insulating substrate 7. Similarly, at a cathode pad 22 formed at the backside surface side, reflux diode 13 is joined to drain pattern 8 to which semiconductor switching element 12 is also joined.

A source pad 17 and a gate pad 18 are formed at the front surface side of semiconductor switching element 12. A termination portion of each of source pad 17 and gate pad 18 is covered with an insulating film 19. Source pad 17, gate pad 18, and drain pad 20 are electrically connected to the source, gate, and drain of semiconductor switching element 12, respectively. The source, gate, and drain of semiconductor switching element 12 are electrically connected to outside of semiconductor switching element 12 via source pad 17, gate pad 18, and drain pad 20.

Similarly, an anode pad 21 is formed at the front surface side of reflux diode 13. A termination portion of anode pad 21 is covered with insulating film. 19. Anode pad 21 and cathode pad 22 are electrically connected to the anode and cathode of reflux diode 13, respectively. The anode and cathode of reflux diode 13 are electrically connected to outside of reflux diode 13 via anode pad 21 and cathode pad 22.

With reference to FIG. 4 again, power semiconductor module 100 has four element-mounted substrates 200, for example. In the exemplary configuration of FIG. 4, power semiconductor module 100 has a configuration corresponding to upper and lower arms of a power conversion device such as an inverter or a converter as in a below-described fifth embodiment. For example, semiconductor switching elements 12 and reflux diodes 13 mounted on two of four element-mounted substrates 200 are connected in parallel between drain electrode 1 and output electrode 35 and operate in parallel, thereby forming the upper arm. That is, drain electrode 1 corresponds to electrode 101 in FIG. 1, and output electrode 35 corresponds to electrode 102 in FIG. 1.

On the other hand, semiconductor switching elements 12 and reflux diodes 13 mounted on the remaining two element-mounted substrates 200 are connected in parallel between output electrode 35 and source electrode 2 and operate in parallel, thereby forming the lower arm. That is, output electrode 35 corresponds to electrode 101 in FIG. 1, and source electrode 2 corresponds to electrode 102 in FIG. 1.

In the power semiconductor module according to the present embodiment, the respective configurations of element-mounted substrates 200 are the same. Further, the power semiconductor module of the present invention can be implemented also by the semiconductor switching elements mounted on a single element-mounted substrate 200. Therefore, the following representatively describes the configuration of single element-mounted substrate 200 (particularly, element-mounted substrate 200 electrically connected between drain electrode 1 and output electrode 35), unless the description is directed to a configuration between the plurality of element-mounted substrates 200. In other words, the power semiconductor module according to the present invention can be implemented by including any number of (one or a plurality of) element-mounted substrates each having a configuration according to each of the embodiments described below, unless a feature lies in the configuration between the plurality of element-mounted substrates 200.

With reference to FIG. 6 and FIG. 7 again, semiconductor switching elements 12 are electrically connected to gate control pattern 10 at respective gate pads 18 by way of gate control wires 15.

Semiconductor switching elements 12 are electrically connected to source control pattern 11 at respective source pads 17 by way of source control wires 16. Source control pattern 11 is electrically connected to source control electrode 3. Respective source control wires 16 are stitched to source pads 17 of semiconductor switching elements 12 and anode pads 21 of reflux diodes 13.

Further, respective source pads 17 of semiconductor switching elements 12 are electrically connected to source pattern 9 on insulating substrate 7 by way of source wires 14 of reflux diodes 13. Respective source wires 14 are stitched to source pads 17 of semiconductor switching elements 12 and anode pads 21 of reflux diodes 13 (FIG. 6).

Gate control pattern 10 is electrically connected to gate control electrode 4. Source pattern 9 is electrically connected to output electrode 35. Further, drain pattern 8 is electrically connected to drain electrode 1.

Moreover, although not shown in the figure, drain pad 20 formed at the backside surface side of each semiconductor switching element 12 is electrically connected to drain pattern 8 on insulating substrate 7. With such a configuration, the plurality of semiconductor switching elements 12 and the plurality of reflux diodes 13 disposed on insulating substrate 7 are electrically connected in parallel between drain electrode 1 and output electrode 35, which respectively correspond to electrodes 101 and 102 of FIG. 1.

Further, source control electrode 3 and gate control electrode 4 each fixed to housing 5 and each composed of a metal are electrically connected to a drive circuit (driver; not shown in the figure) of power semiconductor module 100, whereby a potential difference (i.e., gate voltage) between the source and gate of each semiconductor switching element 12 is controlled by a control signal (representatively, a binary voltage signal in the form of a pulse) output from the drive circuit (driver). Accordingly, the plurality of semiconductor switching elements 12 connected in parallel are controlled to be on/off in the same manner and operate in parallel.

However, in power semiconductor module 100, unintended oscillation (gate oscillation) may occur in the gate voltage of each semiconductor switching element 12 due to: a variation in wiring constant between the plurality of semiconductor switching elements 12 that operate in parallel; an abrupt switching operation thereof; or the like.

For example, in double pulse switching using an L load (inductance), gate oscillation having a large amplitude may occur in the gate voltage of semiconductor switching element 12 when turned on or turned off. This is caused by an LC resonance circuit formed by a parasitic capacitance of semiconductor switching element 12 and a parasitic inductance of a wiring connected to semiconductor switching element 12. Alternatively, in the case where semiconductor switching element 12 is short-circuited due to a malfunction or where a short circuit occurs at the outside of power semiconductor module 100 such as the load side, the gate oscillation may occur when short-circuit current of semiconductor switching element 12 is increased, when the short-circuit current is saturated, or when the short-circuit current is interrupted.

When such gate oscillation occurs, an oxide film or internal gate resistor of semiconductor switching element 12 may be damaged to result in deterioration of the element. Moreover, it is concerned that the current oscillation causes occurrence of radiation noise or propagation noise. Further, when the gate oscillation occurs in one element, the gate oscillation may affect other elements connected in parallel by way of the wirings inside the module.

Therefore, in power semiconductor module 100 according to the present embodiment, a structure for suppressing the gate oscillation is provided by paying attention to such a fact that the wiring connected to semiconductor switching element 12 serves as an oscillation path when a signal input to the gate of semiconductor switching element 12 is oscillated. Specifically, in power semiconductor module 100 according to the present embodiment, the gate oscillation is suppressed by increasing a wiring inductance between respective gate pads 18 of semiconductor switching elements 12 disposed in parallel.

Figure 8:
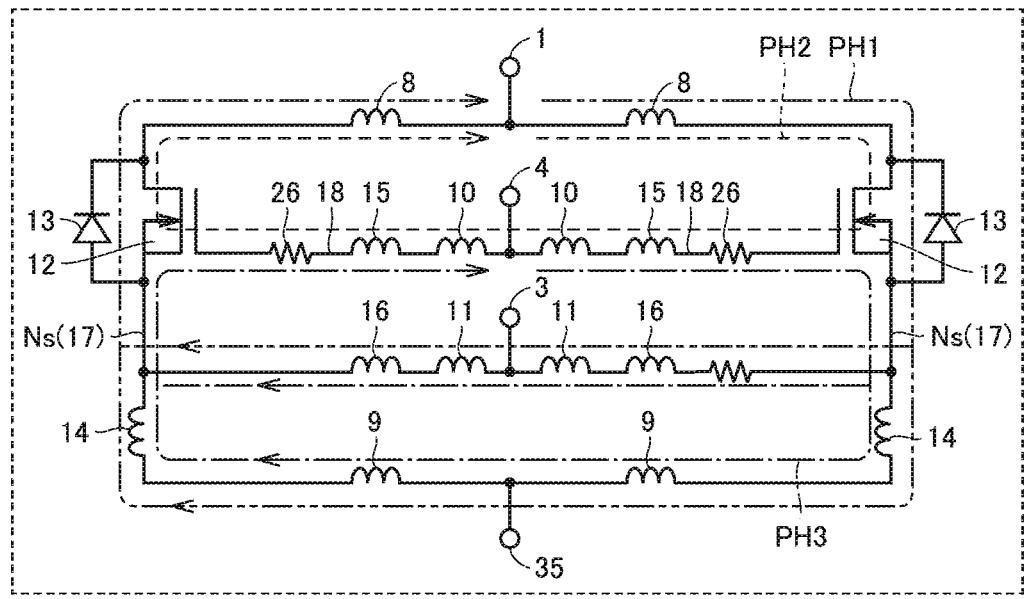
FIG. 8 shows a simple equivalent circuit for components on the element-mounted substrate shown in FIG. 3.

FIG. 8 shows a simple equivalent circuit for the components mounted on the element-mounted substrate shown in FIG. 3. It should be noted that for simplicity, the following describes a configuration in which two semiconductor switching elements 12 and two reflux diodes 13 are connected in parallel in FIG. 8.

With reference to FIG. 8, a wiring inductance in a signal path between respective gate pads 18 of semiconductor switching elements 12 disposed in parallel is a total of inductances of gate control pattern 10 and gate control wires 15. It should be noted that in FIG. 8, a gate resistor 26 is located at the gate side relative to each gate pad 18 and serves as an internal resistor of each semiconductor switching element 12; however, gate resistor 26 can also be connected to outside of gate pad 18. In this case, in FIG. 8, a node between the gate of semiconductor switching element 12 and gate resistor 26 corresponds to gate pad 18.

Respective source pads 17 correspond to nodes Ns in FIG. 8. An inductance provided by source wires 14 and source pattern 9 exists in a path between source pads 17 and output electrode 35. An inductance provided by source control pattern 11 and source control wires 16 exists in a path between source control electrode 3 and source pads 17.

In FIG. 8, a below-described resonance path may be formed by the parasitic capacitance of each semiconductor switching element 12 and the parasitic inductance of the wiring or the like.

A path PH2 passes through a drain-source parasitic capacitance of adjacent semiconductor switching elements 12, drain pattern 8, gate control pattern 10 and gate control wires 15. Moreover, a path PH3 includes: a path passing through a drain-source parasitic capacitance of adjacent semiconductor switching elements 12, source pattern 9, gate control pattern 10, and gate control wires 15; and a path passing through the drain-source parasitic capacitance, gate control pattern 10, gate control wires 15, source control pattern 11 and source control wires 16.

Since each of paths PH2 and PH3 passes through the gates of semiconductor switching elements 12, the gate oscillation may occur when oscillation is amplified. Hence, by increasing the impedance in the signal path between gate pads 18 included in both paths PH2, PH3, oscillation at a high frequency is attenuated, with the result that the gate oscillation can be reduced or suppressed.

A path PH1 includes: a path passing through a drain-source parasitic capacitance of adjacent semiconductor switching elements 12, drain pattern 8, source pattern 9 and source wires 14; and a path passing through the drain-source parasitic capacitance of semiconductor switching elements 12, source control pattern 11 and source control wires 16. Path PH1 does not pass through the gates of semiconductor switching elements 12; however, the gate voltage may be oscillated due to oscillation of drain-source voltage, with the result that the oscillation may be amplified. Therefore, by increasing the impedance in the signal path between gate pads 18, the oscillation at a high frequency is attenuated, with the result that the gate oscillation can be reduced or suppressed.

On the other hand, when the wiring inductance between source pads 17 of semiconductor switching elements 12 that operate in parallel becomes large, the source potentials of semiconductor switching elements 12 connected in parallel are likely to be varied, thus facilitating to induce the oscillation. Therefore, in the present embodiment, by increasing the wiring inductance (impedance) between gate pads 18 to be larger than the wiring inductance (impedance) between source pads 17, the gate oscillation is reduced or suppressed.

The impedance of the wiring inductance has such a characteristic that the impedance of the wiring inductance becomes larger as the frequency is higher. Hence, a high impedance is provided for a signal (for example, an oscillation signal) having a high frequency. Moreover, the inductance of the signal path has such a characteristic that the inductance of the signal path becomes larger as the distance of the path is longer or as the width of the path is smaller. Therefore, the inductance can be increased by way of design of gate control pattern 10 and/or each gate control wire 15.

In FIG. 7, as one example for increasing the wiring inductance of the path between gate pads 18 to be larger than the wiring inductance between source pads 17, gate control pattern 10 is disposed to interpose source control pattern 11 between gate control pattern 10 and semiconductor switching element 12. Accordingly, gate control wire 15 extends over source control pattern 11 and is connected to gate control pattern 10. Accordingly, gate control wire 15 becomes longer than that in a configuration in which gate control pattern 10 is disposed close to semiconductor switching elements 12 with no source control pattern 11 being interposed therebetween. Moreover, gate control wire 15 is longer than source control wire 16. As a result, the impedance of gate control wire 15, i.e., the impedance of the path upon occurrence of the gate oscillation can be increased. As a result, the gate oscillation can be reduced or suppressed.

That is, source control pattern 11 corresponds to one example of the "main electrode control pattern", gate control pattern 10 corresponds to one example of the "control electrode control pattern", source pad 17 corresponds to one example of the "main electrode pad", and gate pad 18 corresponds to one example of the "control electrode pad". Further, source control wire 16 corresponds to one example of the "first wire", and gate control wire 15 corresponds to one example of the "second wire".

Alternatively, the wiring inductance of the path between gate pads 18 can be made larger than the wiring inductance between source pads 17 by decreasing the diameter of gate control wire 15 to be smaller than the diameter of source control wire 16, i.e., by decreasing the cross sectional area of gate control wire 15 to be smaller than the cross sectional area of source control wire 16.

Moreover, the impedance of gate control wire 15 can be increased also when gate control wire 15 is coated with a material having a relative permeability of more than or equal to 1 such as ferrite or when gate control wire 15 contains the material as a constituent of the wire. As a result, the wiring inductance of the path between gate pads 18 can be larger than the wiring inductance between source pads 17.

Thus, according to the power semiconductor module according to the first embodiment, the inductance of gate control wire 15 is increased by using at least one of: the wiring length of gate control wire 15 by arranging the position of gate control pattern 10; the diameter of gate control wire 15; and the material of gate control wire 15. Accordingly, the wiring inductance of the path between gate pads 18 of semiconductor switching elements 12 connected in parallel can be larger than the wiring inductance between source pads 17. As a result, the gate oscillation in the plurality of semiconductor switching elements 12 connected in parallel can be suppressed without increasing power loss due to an increased electric resistance value of the path for the main current (drain-source current) of each of semiconductor switching elements 12.

Figure 9:
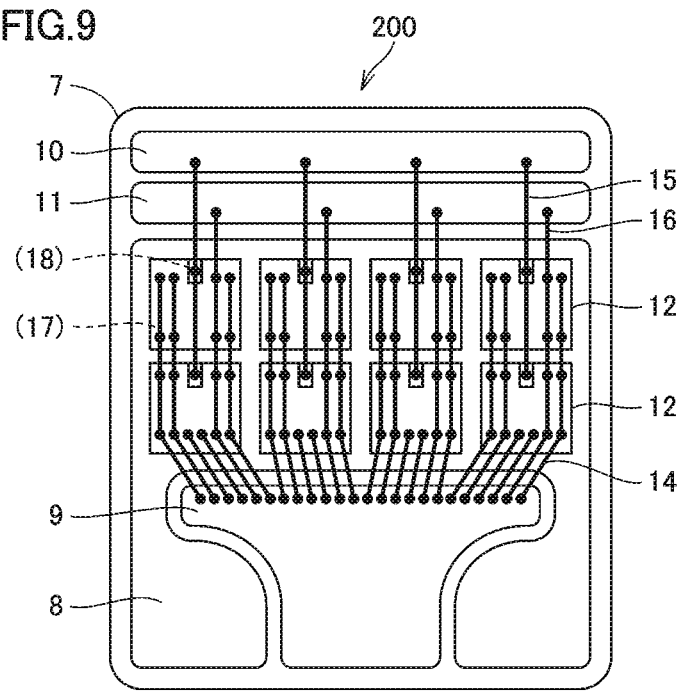
FIG. 9 is a schematic top view of an element-mounted substrate of a power semiconductor module according to a modification of the first embodiment.

It should be noted that for a modification of power semiconductor module 100 according to the first embodiment, FIG. 9 shows a schematic top view of an element-mounted substrate similar to that in FIG. 7.

With reference to FIG. 9, in the modification of power semiconductor module 100 according to the first embodiment, a plurality (eight in the example of FIG. 9) of semiconductor switching elements 12 are connected in parallel without disposing reflux diodes 13 as shown in FIG. 2. It is understood that the configuration of FIG. 9 is obtained by replacing reflux diodes 13 with semiconductor switching elements 12 in FIG. 7. Therefore, also in the configuration in which only semiconductor switching elements 12 are connected in parallel as shown in FIG. 2, the gate oscillation can be suppressed by employing the configuration for increasing the impedance of gate control wire 15 as with the first embodiment.

Second Embodiment

In a second embodiment, the following describes a configuration for increasing the inductance between the gates by way of a shape of gate control pattern 10. In the second or subsequent embodiments, the same matters as those in the first embodiment will not be described repeatedly.

FIG. 10 is a schematic top view of an element-mounted substrate similar to that in FIG. 7 for illustrating a first exemplary configuration of power semiconductor module 100 according to the second embodiment.

In comparison between FIG. 10 and FIG. 7, in the first exemplary configuration of power semiconductor module 100 according to the second embodiment, gate control pattern 10 is configured to have a width smaller than that of source control pattern 11. It should be noted that in the present embodiment, the width of gate control pattern 10 means the width of the signal path between the gates of semiconductor switching elements 12 connected in parallel. That is, in each of the schematic top views of FIG. 7, FIG. 10 and the like, the lateral direction of gate control pattern 10 corresponds to the direction of the signal path between the gates of semiconductor switching elements 12 connected in parallel, and the vertical direction of gate control pattern 10 corresponds to the width direction of the signal path.

By reducing the width of gate control pattern 10 in this way, the wiring inductance between the gate pads can be increased. Moreover, in FIG. 10, gate control pattern 10 is disposed close to semiconductor switching elements 12 with no source control pattern 11 being interposed therebetween unlike in FIG. 7; however, with the reduced width of gate control pattern 10, the wiring inductance (impedance) between gate pads 18 can be made large.

That is, the gate oscillation can be reduced or suppressed when the wiring inductance (impedance) between gate pads 18 can be made larger than the wiring inductance (impedance) between source pads 17 by reducing the width of gate control pattern 10 to be smaller than the width of source control pattern 11.

FIG. 11 shows a second exemplary configuration of power semiconductor module 100 according to the second embodiment.

When the impedance between gate pads 18 can be made larger than the impedance between source pads 17 by the impedance increased by the reduced width of gate control pattern 10, gate control pattern 10 does not need to be disposed side by side with source control pattern 11 as shown in FIG. 10.

With reference to FIG. 11, gate control pattern 10 may be disposed at a position interposed between drain pattern 8 and source pattern 9. Also in the exemplary configuration of FIG. 11, gate control pattern 10 is configured to have a width smaller than that of source control pattern 11. It is understood that the inductance (impedance) of gate control pattern 10 is larger than the inductance (impedance) of source control pattern 11.

FIG. 12 shows a third exemplary configuration of power semiconductor module 100 according to the second embodiment.

With reference to FIG. 12, gate control pattern 10 is configured to have a width smaller than that of source control pattern 11 as in FIG. 10 and FIG. 11, and is disposed to interpose source control pattern 11 between gate control pattern 10 and semiconductor switching element 12 as in FIG. 7.

As a result, the impedance of gate control wire 15 can be increased as in the first embodiment in addition to the impedance of gate control pattern 10, whereby the impedance between gate pads 18 can be further increased. Therefore, the effect of reducing or suppressing the gate oscillation can be further increased.

Figure 14:
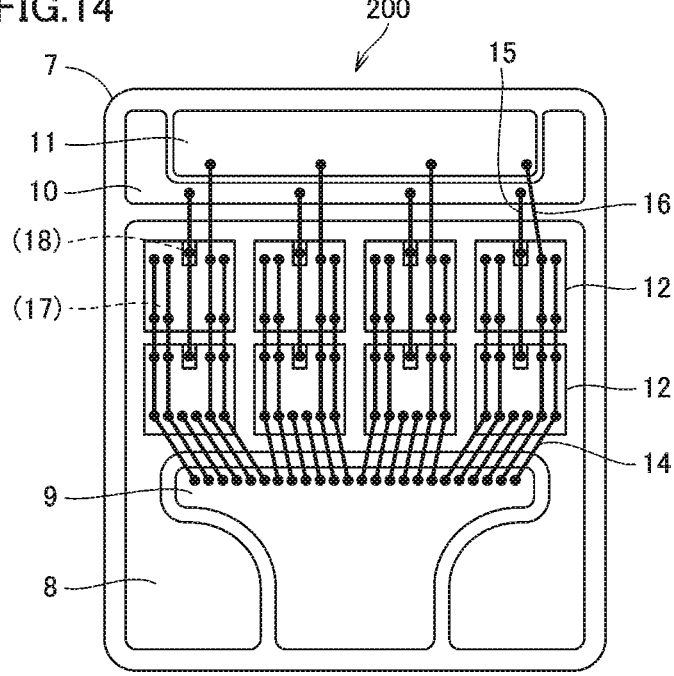
FIG. 14 is a schematic top view of an element-mounted substrate for illustrating a fifth exemplary configuration of the power semiconductor module according to the second embodiment.

FIG. 13 and FIG. 14 respectively show fourth and fifth exemplary configurations of power semiconductor module 100 according to the second embodiment. In each of FIG. 13 and FIG. 14, gate control pattern 10 does not have a uniform width, and has a portion having a reduced width as in FIG. 10 to FIG. 12.

With reference to FIG. 13, in gate control pattern 10 disposed in a manner similar to that in FIG. 10, an area connected to gate control wires 15 and serving as the signal path between the gates of semiconductor switching elements 12 has a width smaller than those of the other areas of gate control pattern 10.

With reference to FIG. 14, in gate control pattern 10 disposed in a manner similar to that in FIG. 12, an area connected to gate control wires 15 and serving as the signal path between the gates of semiconductor switching elements 12 has a width smaller than those of the other areas of gate control pattern 10.

In each of the exemplary configurations of FIG. 13 and FIG. 14, when the width of gate control pattern 10 is smaller than the width of source control pattern 11 at the area having the reduced width, the effect of reducing or suppressing the gate oscillation is attained even though the widths of the other areas of gate control pattern 10 are the same as or wider than that of source control pattern 11.

Figure 15:
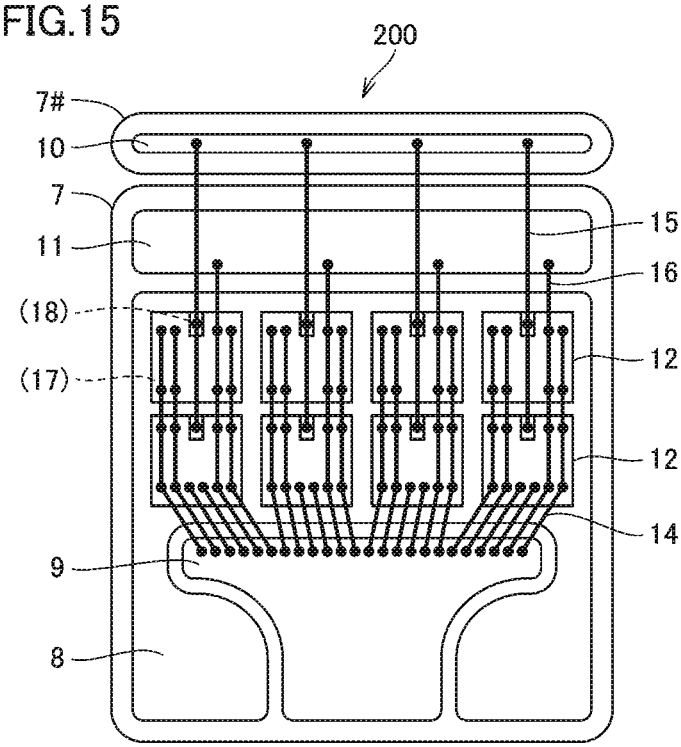
FIG. 15 is a schematic top view of an element-mounted substrate for illustrating a sixth exemplary configuration of the power semiconductor module according to the second embodiment.
Figure 16:
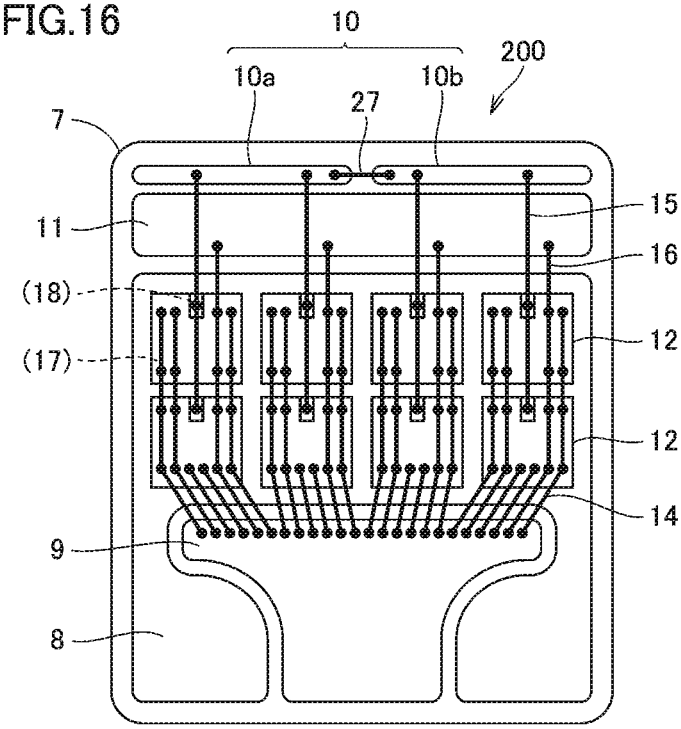
FIG. 16 is a schematic top view of an element-mounted substrate for illustrating a seventh exemplary configuration of the power semiconductor module according to the second embodiment.

FIG. 15 and FIG. 16 respectively show sixth and seventh exemplary configurations of power semiconductor module 100 according to the second embodiment.

With reference to FIG. 15, gate control pattern 10 having a reduced width can be disposed on an insulating substrate 7 #different from insulating substrate 7 on which semiconductor switching elements 12 are mounted.

Alternatively, with reference to FIG. 16, gate control pattern 10 having a reduced width may be divided into a plurality of patterns 10a, 10b, and may be disposed on insulating substrate 7. Divided patterns 10a, 10b are connected to each other by a gate control pattern connecting wire 27, thereby forming gate control pattern 10.

Also in each of the configurations of FIG. 15 and FIG. 16, the gate oscillation can be reduced or suppressed by increasing the wiring inductance (impedance) provided by gate control pattern 10 to be larger than the wiring inductance (impedance) provided by source control pattern 11.

Figure 17:
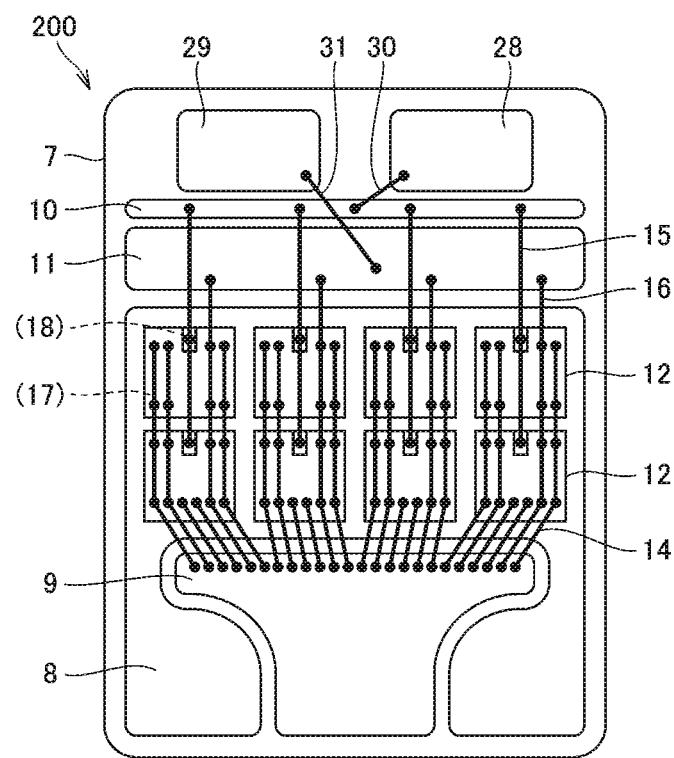
FIG. 17 is a schematic top view of an element-mounted substrate for illustrating an eighth exemplary configuration of the power semiconductor module according to the second embodiment.
Figure 18:
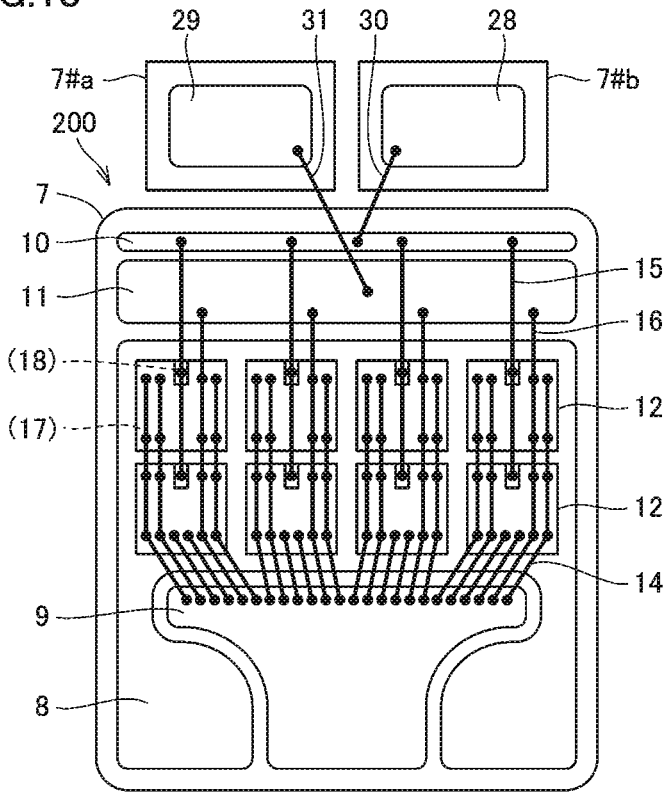
FIG. 18 is a schematic top view of an element-mounted substrate for illustrating a ninth exemplary configuration of the power semiconductor module according to the second embodiment.

FIG. 17 and FIG. 18 respectively show eighth and ninth exemplary configurations of power semiconductor module 100 according to the second embodiment.

In the exemplary configuration of FIG. 17, a gate control pattern 28 and a source control pattern 29 are provided on insulating substrate 7 in addition to the same gate control pattern 10 and source control pattern 11 as those in FIG. 12. Gate control pattern 10 and gate control pattern 28 are electrically connected to each other by a gate control pattern connecting wire 30. Similarly, source control pattern 11 and source control pattern 29 are electrically connected to each other by source control pattern connecting wire 31. Gate control pattern connecting wire 30 corresponds to one example of the "pattern connecting wire".

In the exemplary configuration of FIG. 18, the same gate control pattern 28 and source control pattern 29 as those in FIG. 17 are respectively disposed on insulating substrates 7 #a, 7 #b different from insulating substrate 7 on which semiconductor switching elements 12 are mounted. Therefore, gate control pattern connecting wire 30 electrically connects gate control pattern 10 and gate control pattern 28, which are respectively disposed on insulating substrates 7 and 7 #a, to each other. Similarly, source control pattern connecting wire 31 electrically connects source control pattern 11 and source control pattern 29, which are respectively disposed on insulating substrates 7 and 7 #b, to each other.

Also in each of the configurations of FIG. 17 and FIG. 18, since gate control pattern 10 has a width smaller than that of source control pattern 11, the gate oscillation can be reduced or suppressed by increasing the wiring inductance (impedance) between gate pads 18 of semiconductor switching elements 12 to be larger than the wiring inductance (impedance) between source pads 17.

Further, in each of the exemplary configurations of FIG. 17 and FIG. 18, the effect of suppressing the gate oscillation can be further increased by connection locations for gate control pattern connecting wire 30 and source control pattern connecting wire 31.

Figure 19:
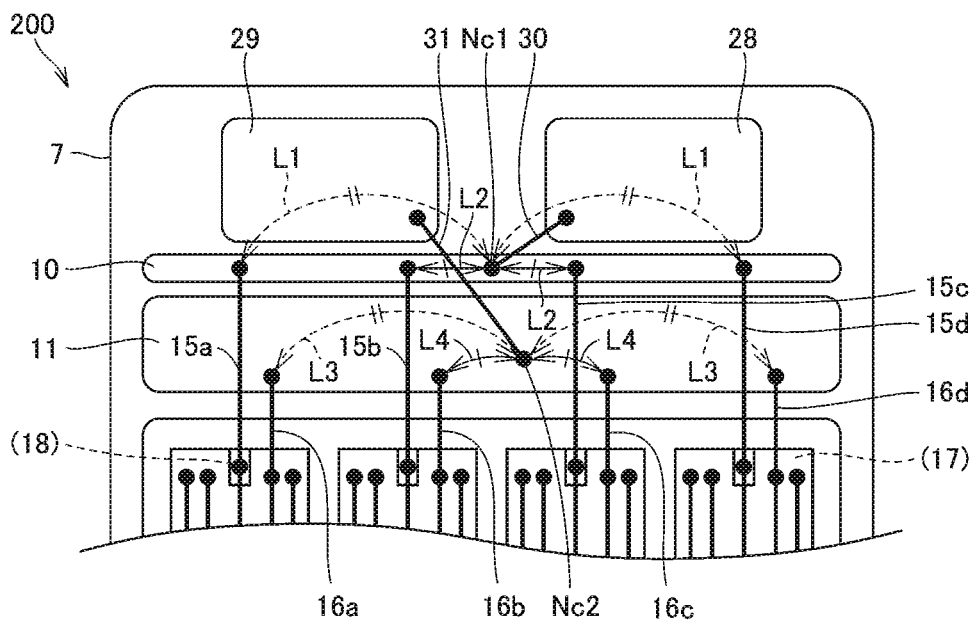
FIG. 19 is a partial schematic top view for illustrating preferable connection locations for wires in the exemplary configuration of each of FIG. 17 and FIG. 18.

FIG. 19 is a partial schematic top view for illustrating preferable connection locations for the wires in each of the exemplary configurations of FIG. 17 and FIG. 18.

With reference to FIG. 19, gate control pattern connecting wire 30 is connected to gate control pattern 10 at a node Nc1. Moreover, gate pads 18 (FIG. 6) of four semiconductor switching elements 12 are connected to gate control pattern 10 by gate control wires 15a to 15d. On this occasion, node Nc1 is positioned to provide a combination of equal distances between node Nc1 and the connection locations for gate control wires 15a to 15d in gate control pattern 10.

For example, on gate control pattern 10 of FIG. 19, a distance (L1) between node Nc1 and the connection location for gate control wire 15a is equal to a distance (L1) between node Nc1 and the connection location for gate control wire 15d. Further, a distance (L2) between node Nc1 and the connection location for gate control wire 15b is equal to a distance (L2) between node Nc1 and the connection location for gate control wire 15c. That is, node Nc1 corresponds to one example of the "first connection location", and each of the connection locations for gate control wires 15a to 15d on gate control pattern 10 corresponds to one example of the "second connection location".

Similarly, source control pattern connecting wire 31 is connected to source control pattern 11 at a node Nc2. Source pads 17 (FIG. 6) of four semiconductor switching elements 12 are connected to source control pattern 11 by source control wires 16a to 16d. On this occasion, node Nc2 is positioned to provide a combination of equal distances between node Nc2 and the connection locations for source control wires 16a to 16d in source control pattern 11.

For example, on source control pattern 11 of FIG. 19, a distance (L3) between node Nc2 and the connection location for source control wire 16a is equal to a distance (L3)

between node Nc2 and the connection location for source control wire 16d. Further, a distance (L4) between node Nc2 and the connection location for source control wire 16b is equal to a distance (L4) between node Nc2 and the connection location for source control wire 16c.

With such a configuration, a gate control signal supplied from the drive circuit (not shown) to control the gate voltage (gate-source voltage) of each semiconductor switching element 12 can be equally provided to the plurality of semiconductor switching elements 12 connected in parallel. Accordingly, the variation in switching of semiconductor switching elements 12 that operate in parallel can be suppressed, whereby the effect of suppressing the gate oscillation can be further increased.

Thus, when there are an even number of semiconductor switching elements 12 connected in parallel, i.e., when there are 2n (n: natural number) semiconductor switching elements 12 connected in parallel, node Nc1 is positioned to provide n sets of semiconductor switching elements 12 for which distances between node Nc1 and the connection locations fir gate control wires 15 are equal to each other in gate control pattern 10. Also in source control pattern 11, node Nc2 is preferably positioned to provide n sets of semiconductor switching elements 12 for which distances between node Nc2 and the connection locations for source control wires 16 are equal to each other.

It should be noted that when an odd number of semiconductor switching elements 12, i.e., 2n+1 (n: natural number) semiconductor switching elements 12 are connected in parallel, each of nodes Nc1 and Nc2 is positioned to provide the n sets of semiconductor switching elements 12 from 2n semiconductor switching elements 12 in the same manner as described above with one semiconductor switching element 12 being excluded, whereby the effect of suppressing the gate oscillation can be increased.

Further, in FIG. 19, it has been described that gate control pattern 28 and source control pattern 29 are disposed on insulating substrate 7 as in FIG. 17; however, also in the configuration in which gate control pattern 28 and source control pattern 29 are disposed on insulating substrates 7 #a, 7 #b as in FIG. 18, the connection location (node Nc1) for gate control pattern connecting wire 30 in gate control pattern 10 and the connection location (node Nc2) for source control pattern connecting wire 31 in source control pattern 11 can be positioned in the same manner as in FIG. 19.

Third Embodiment

When a larger number of semiconductor switching elements connected in parallel are mounted on the same insulating substrate, the size of the substrate becomes large. When the insulating substrate becomes large in size, it is concerned that a yield is decreased due to the following reasons: a ratio of occurrence of cracking and breakage due to stress is increased; and when a chip is deteriorated or broken after an assembly step, a defective product is caused by unit of the insulating substrate.

Therefore, when a multiplicity of semiconductor switching elements are mounted on the power semiconductor module, it is effective to dispose the semiconductor switching elements on a plurality of insulating substrates in a distributed manner. In the third embodiment, the following describes suppression of the gate oscillation in a configuration in which the plurality of semiconductor switching elements 12 connected in parallel are disposed on a plurality of insulating substrates in the distributed manner.

Figure 20:
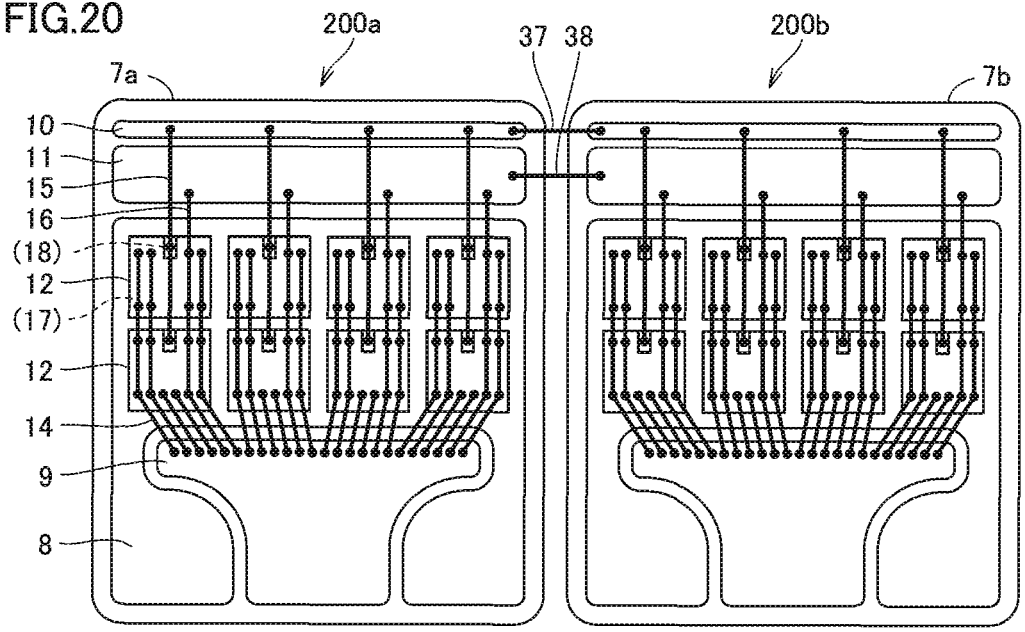
FIG. 20 is a schematic top view of element-mounted substrates for illustrating a first exemplary configuration of a power semiconductor module according to a third embodiment.

FIG. 20 is a schematic top view of element-mounted substrates for illustrating a first exemplary configuration of the power semiconductor module according to the third embodiment.

With reference to FIG. 20, the plurality of semiconductor switching elements 12 are disposed on a plurality of insulating substrates 7a, 7b in a distributed manner. Accordingly, power semiconductor module 100 includes a plurality of element-mounted substrates 200a and 200b electrically connected in parallel.

Each of FIG. 1 and FIG. 2 shows the example in which four element-mounted substrates 200 are provided. In the third embodiment, a feature of an electric connection configuration between two element-mounted substrates 200a and 200b will be illustrated. That is, in the power semiconductor module including any plural number of element-mounted substrates 200, electric connection between different element-mounted substrates 200 can be configured as described below.

Each of element-mounted substrates 200a, 200b is configured in the same manner as element-mounted substrate 200 of FIG. 12, for example. Therefore, in each of element-mounted substrates 200a, 200b, gate control pattern 10 has a width smaller than that of source control pattern 11, and is disposed to interpose source control pattern 11 between gate control pattern 10 and each of semiconductor switching elements 12.

Further, between the plurality of element-mounted substrates 200a and 200b, respective gate control patterns 10 are electrically connected to each other by a gate control pattern connecting wire 37, and respective source control patterns 11 are electrically connected to each other by a source control pattern connecting wire 38. It should be noted that although not shown in the figure, between the plurality of element-mounted substrates 200a and 200b, respective drain patterns 8 are also electrically connected to each other via an electrode, a wire or the like, which are not shown in the figure, and respective source patterns 9 are also electrically connected to each other via an electrode, a wire or the like, which are not shown in the figure.

In the exemplary configuration of FIG. 20, semiconductor switching elements 12 mounted on different element-mounted substrates 200a and 200b are connected in parallel by gate control pattern connecting wire 37, source control pattern connecting wire 38, and the like, and operate in parallel. In this case, also in the parallel connection via gate control pattern connecting wire 37 and source control pattern connecting wire 38, the inductance between the gate pads can be made larger than the inductance between the source pads by configuring each of element-mounted substrates 200a, 200b in the same manner as in the first embodiment and/or the second embodiment. That is, source control pattern connecting wire 38 corresponds to one example of the "third wire", and gate control pattern connecting wire 37 corresponds to one example of the "fourth wire".

Further, the impedance (inductance) of gate control pattern connecting wire 37 can be made larger than the impedance (inductance) of source control pattern connecting wire 38 by making a difference between gate control pattern connecting wire 37 and source control pattern connecting wire 38 in terms of at least one of the wire length, the diameter, and the material (inclusive of a coating film) as described in the first embodiment. Accordingly, the effect of reducing or suppressing the gate oscillation is further increased.

Figure 21:
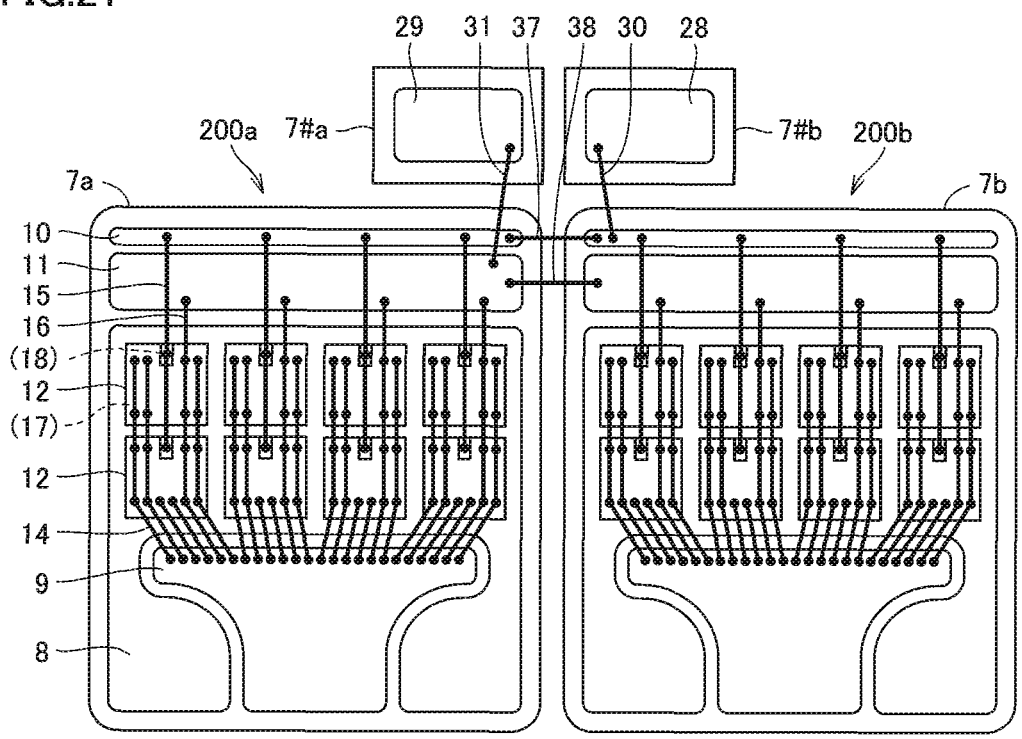
FIG. 21 is a schematic top view of element-mounted substrates for illustrating a second exemplary configuration of the power semiconductor module according to the third embodiment.
Figure 22:
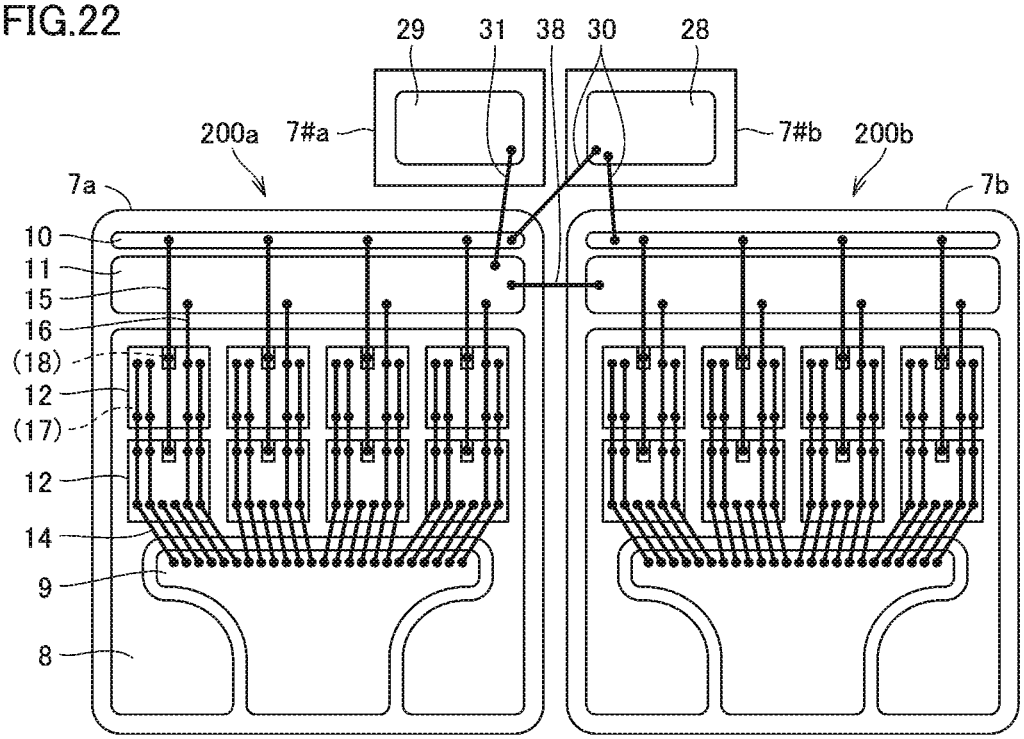
FIG. 22 is a schematic top view of element-mounted substrates for illustrating a third exemplary configuration of the power semiconductor module according to the third embodiment.

FIG. 21 and FIG. 22 are schematic top views of element-mounted substrates for illustrating second and third exemplary configurations of the power semiconductor module according to the third embodiment.

With reference to FIG. 21, a gate control pattern 28 formed on an insulating substrate 7 #b different from insulating substrate 7 on which semiconductor switching elements 12 are mounted can be connected to gate control patterns 10 electrically connected to each other between the plurality of element-mounted substrates 200a and 200b. In this case, one gate control pattern 10 and gate control pattern 28 can be electrically connected to each other by a gate control pattern connecting wire 30.

Further, a source control pattern 29 formed on an insulating substrate 7 #a different from insulating substrate 7 on which semiconductor switching elements 12 are mounted can be connected to source control patterns 11 electrically connected to each other between the plurality of element-mounted substrates 200a and 200b. In this case, one source control pattern 11 and source control pattern 29 can be electrically connected to each other by a source control pattern connecting wire 31.

Also in the configuration of FIG. 21, the effect of reducing or suppressing the gate oscillation can be obtained by increasing the inductance between gate pads 18 to be larger than the inductance between source pads 17 of semiconductor switching elements 12 connected in parallel across the plurality of element-mounted substrates 200a and 200b.

The exemplary configuration of FIG. 22 is different from that of FIG. 21 in that gate control pattern 28 on insulating substrate 7 #b is connected to gate control patterns 10 on insulating substrates 7a, 7b by a plurality of gate control pattern connecting wires 30. Further, gate control pattern connecting wire 37 for directly connecting gate control patterns 10 to each other is not disposed. The other portions of FIG. 22 are the same as those of FIG. 21 and therefore will not be described in detail repeatedly.

In the exemplary configuration of FIG. 22, gate control patterns 10 are connected to each other between the plurality of element-mounted substrates 200a and 200b via a detoured path provided by gate control pattern connecting wires 30 and gate control pattern 28, rather than the path provided by gate control pattern connecting wire 37. Accordingly, the inductance (impedance) in the connection structure for gate control patterns 10 is increased. Hence, the effect of reducing or suppressing the gate oscillation can be further increased by further increasing the inductance between gate pads 18 of semiconductor switching elements 12 connected in parallel.

Thus, according to the power semiconductor module according to the third embodiment, the gate oscillation can be reduced or suppressed by increasing the inductance between the gate pads of semiconductor switching elements 12 that are disposed on the different element-mounted substrates in the distributed manner and that operate in parallel.

Fourth Embodiment

In a fourth embodiment, the following describes a configuration for increasing the effect of reducing or suppressing the gate oscillation by reducing the wiring inductance between the source pads of the semiconductor switching elements connected in parallel. Also in the fourth embodiment, as with the first and second embodiments, the configuration of each element-mounted substrate 200 will be described.

Figure 23:
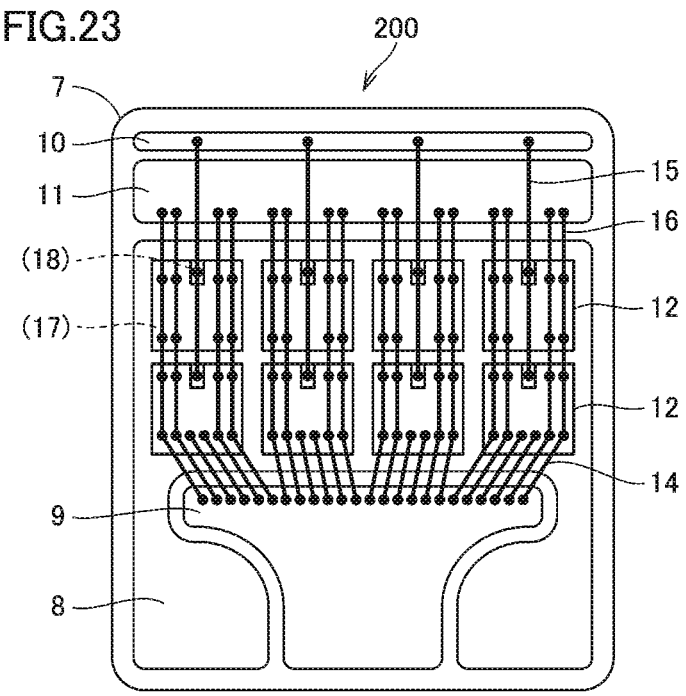
FIG. 23 is a schematic top view of an element-mounted substrate for illustrating a first exemplary configuration of a power semiconductor module according to a fourth embodiment.

FIG. 23 is a schematic top view of an element-mounted substrate for illustrating a first exemplary configuration of a power semiconductor module according to the fourth embodiment.

With reference to FIG. 23, element-mounted substrate 200 is configured in the same manner as in FIG. 12, for example. Therefore, in element-mounted substrate 200, gate control pattern 10 has a width smaller than that of source control pattern 11, and is disposed to interpose source control pattern 11 between gate control pattern 10 and each of semiconductor switching elements 12.

Further, the number of source control wires 16 for connecting respective source pads 17 of semiconductor switching elements 12 to source control pattern 11 is more than the number of gate control wires 15 for connecting respective gate pads 18 to gate control pattern 10. For example, in the example of FIG. 23, one gate control wire 15 is disposed for each semiconductor switching element 12, whereas four source control wires 16 are disposed for each semiconductor switching element 12.

By configuring in this way, the wiring inductance (impedance) is reduced in the path extending through source control pattern 11 and source control wires 16 between source pads 17 of the plurality of semiconductor switching elements 12 connected in parallel.

As a result, variation in the source potentials of semiconductor switching elements 12 connected in parallel is reduced, whereby oscillation is less likely to be induced. Accordingly, in addition to the effect provided by increasing the wiring inductance (impedance) between gate pads 18, the gate oscillation can be further reduced or suppressed.

Figure 24:
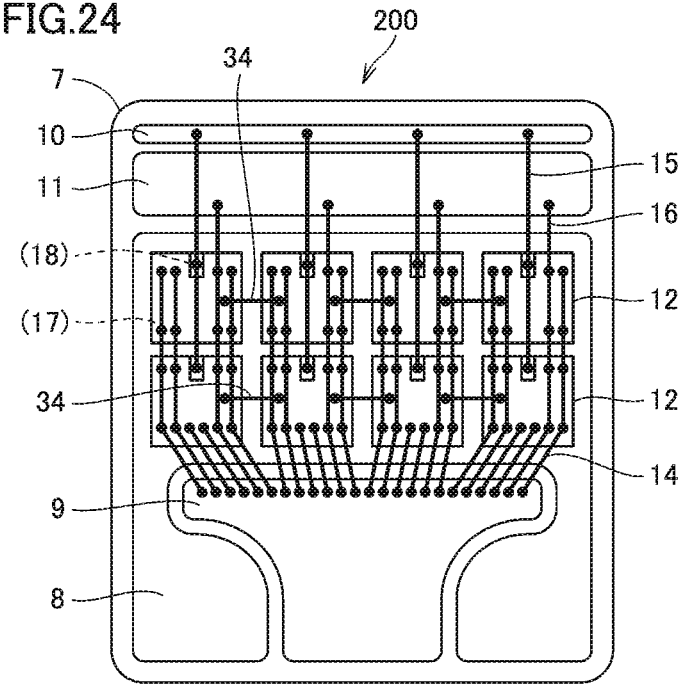
FIG. 24 is a schematic top view of an element-mounted substrate for illustrating a second exemplary configuration of the power semiconductor module according to the fourth embodiment.

FIG. 24 is a schematic top view of an element-mounted substrate for illustrating a second exemplary configuration of the power semiconductor module according to the fourth embodiment.

In the exemplary configuration of FIG. 24, in comparison with FIG. 23, source pad connecting wires 34 are further disposed. Each of source pad connecting wires 34 directly and electrically connects between source pads 17 of semiconductor switching elements 12. Accordingly, the wiring inductance (impedance) between source pads 17 of the plurality of semiconductor switching elements 12 connected in parallel is further reduced, whereby the effect of reducing or suppressing the gate oscillation is further increased.

Figure 25:
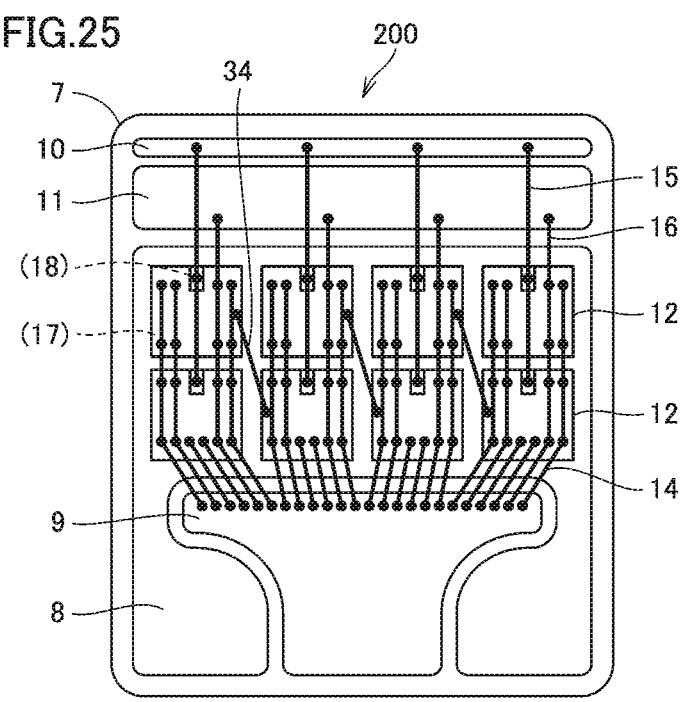
FIG. 25 is a schematic top view of an element-mounted substrate for illustrating a third exemplary configuration of the power semiconductor module according to the fourth embodiment.
Figure 26:
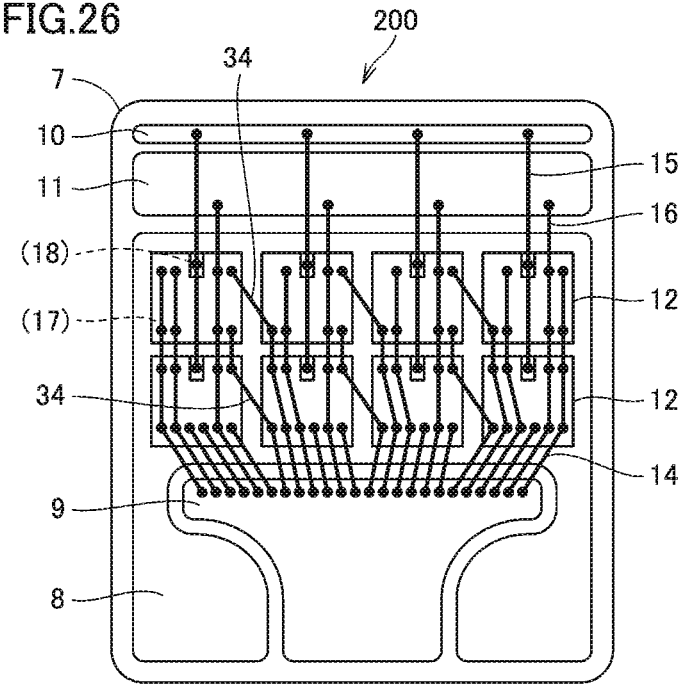
FIG. 26 is a schematic top view of an element-mounted substrate for illustrating a fourth exemplary configuration of the power semiconductor module according to the fourth embodiment.
Figure 27:
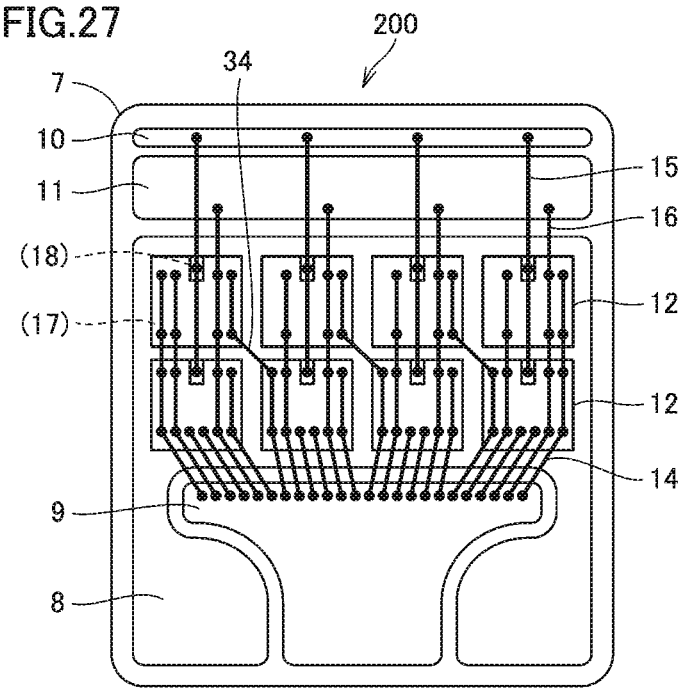
FIG. 27 is a schematic top view of an element-mounted substrate for illustrating a fifth exemplary configuration of the power semiconductor module according to the fourth embodiment.

FIG. 25 to FIG. 27 are schematic top views of element-mounted substrates for illustrating third to fifth exemplary configurations of the power semiconductor module according to the fourth embodiment.

FIG. 25 to FIG. 27 show respective modifications in terms of positioning of source pad connecting wires 34 shown in FIG. 24. That is, one or a plurality of source pad connecting wires 34 are disposed at appropriate location(s) so as to increase parallel connection paths between source pads 17 of semiconductor switching elements 12, whereby the effect of reducing or suppressing the gate oscillation can be obtained by reducing the wiring inductance (impedance) between source pads 17. That is, source pad connecting wire 34 corresponds to one example of the "fifth wire".

Figure 28:
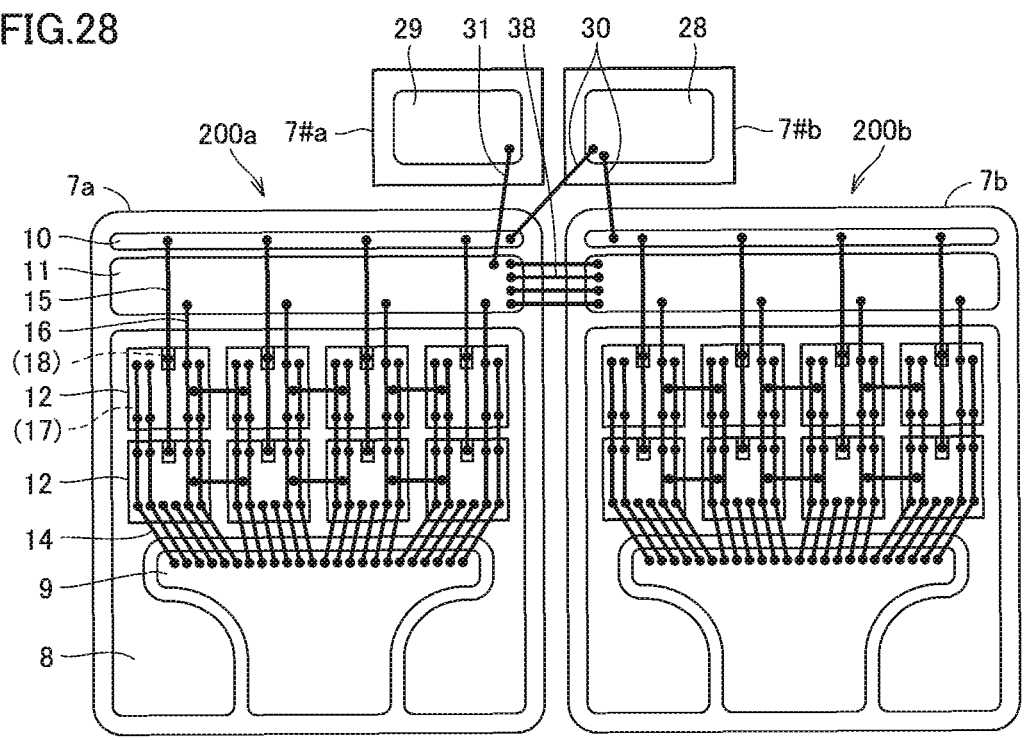
FIG. 28 is a schematic top view of element-mounted substrates for illustrating a sixth exemplary configuration of the power semiconductor module according to the fourth embodiment.

FIG. 28 is a schematic top view of element-mounted substrates for illustrating a sixth exemplary configuration of the power semiconductor module according to the fourth embodiment.

The exemplary configuration of FIG. 28 is different from that of FIG. 22 in that there are provided a plurality of source control pattern connecting wires 38 for electrically connecting source control patterns 11 to each other between the plurality of element-mounted substrates 200. The other portions of FIG. 28 are the same as those of FIG. 22 and therefore will not be described in detail repeatedly.

Accordingly, it is possible to further reduce the inductance (impedance) of the path that connects between source control patterns 11 of the plurality of element-mounted substrates 200 on which semiconductor switching elements 12 connected in parallel are disposed in the distributed manner.

It should be noted that in the configuration of FIG. 21, by disposing both gate control pattern connecting wire 37 and source control pattern connecting wire 38, gate control patterns 10 are electrically connected to each other and source control patterns 11 are electrically connected to each other between the plurality of element-mounted substrates 200a, 200b. Also in such a configuration, by employing a plurality of source control pattern connecting wires 38 so as to increase the number of source control pattern connecting wires 38 to be more than the number of gate control pattern connecting wires 37, the inductance (impedance) of the path that connects between source control patterns 11 can be reduced in the same manner as in FIG. 28.

Figure 29:
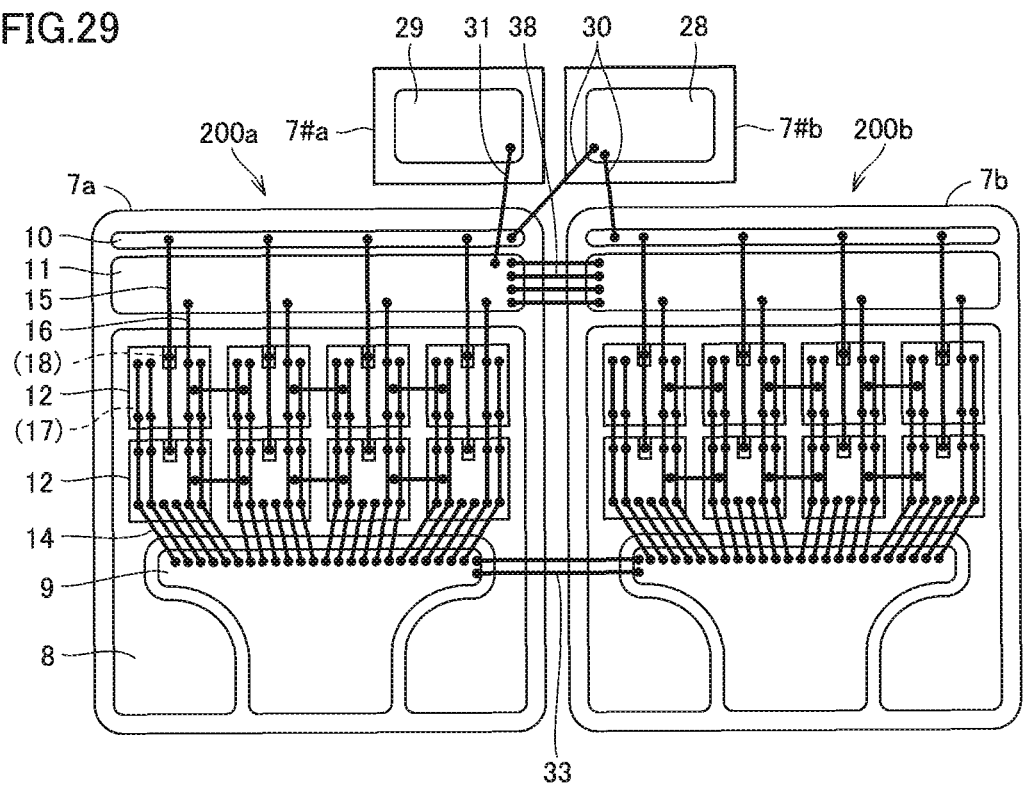
FIG. 29 is a schematic top view of element-mounted substrates for illustrating a seventh exemplary configuration of the power semiconductor module according to the fourth embodiment.

FIG. 29 is a schematic top view of element-mounted substrates for illustrating a seventh exemplary configuration of the power semiconductor module according to the fourth embodiment.

In the exemplary configuration of FIG. 29, in comparison with FIG. 28, source patterns 9 are connected to each other by source pattern connecting wires 33 between the plurality of element-mounted substrates 200a, 200b on which semiconductor switching elements 12 are disposed in the distributed manner. The other portions of FIG. 29 are the same as those of FIG. 28 and therefore will not be described in detail repeatedly.

By disposing source pattern connecting wires 33, variation in the source potentials of semiconductor switching elements 12 on element-mounted substrates 200a, 200b can be reduced. Alternatively, source patterns 9 on different element-mounted substrate 200a, 200h can be connected to each other using an electrode (not shown). That is, source pattern connecting wire 33 corresponds to one example of the "sixth wire".

Figure 30:
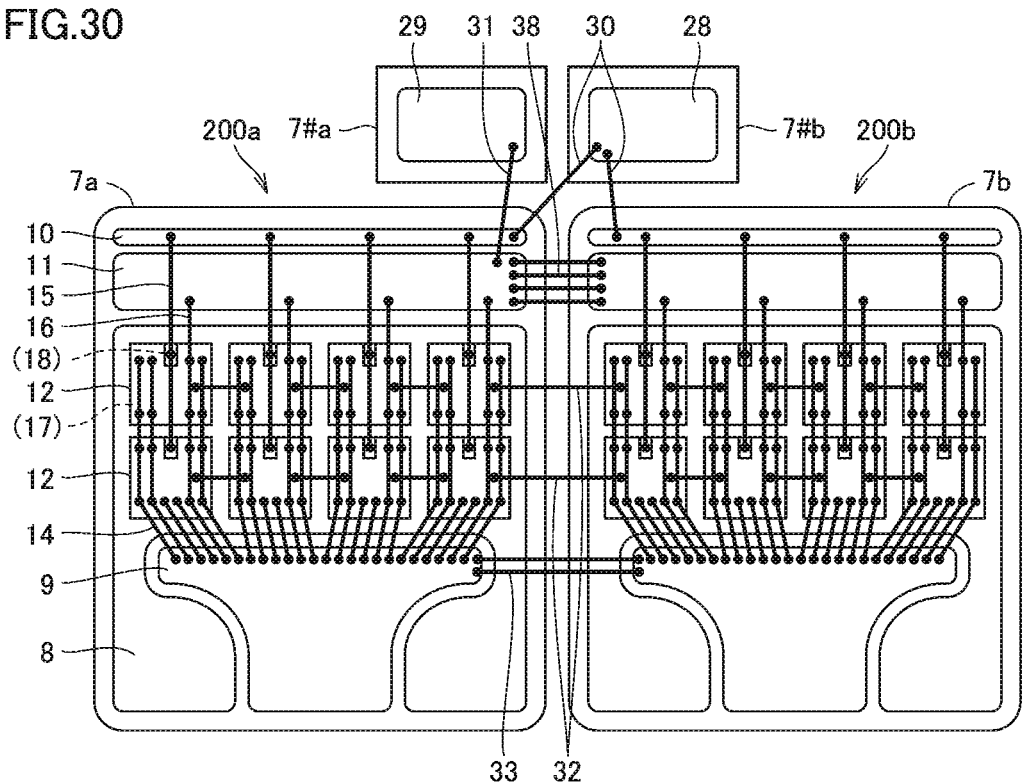
FIG. 30 is a schematic top view of element-mounted substrates for illustrating an eighth exemplary configuration of the power semiconductor module according to the fourth embodiment.

FIG. 30 is a schematic top view of element-mounted substrates for illustrating an eighth exemplary configuration of the power semiconductor module according to the fourth embodiment.

In the exemplary configuration of FIG. 30, in comparison with FIG. 29, source pads 17 of semiconductor switching elements 12 are further directly connected to each other by source pad connecting wires 32 between the plurality of element-mounted substrates 200. The other portions of FIG. 30 are the same as those of FIG. 29 and therefore will not be described in detail repeatedly. By disposing source pad connecting wires 32, the variation in the source potentials of semiconductor switching elements 12 on different element-mounted substrates 200 can be further reduced. That is, source pad connecting wire 32 corresponds to one example of the "seventh wire".

Thus, according to the power semiconductor module according to the fourth embodiment, the gate oscillation can be reduced or suppressed by reducing the variation in the source potentials of semiconductor switching elements 12 that are mounted on the different element-mounted substrates 200 and that operate in parallel.

It should be noted that in each of the second to fourth embodiments (FIG. 10 to FIG. 30), there have been described the exemplary configurations of the power semiconductor module, in each of which only the plurality of semiconductor switching elements 12 are connected in parallel without disposing reflux diodes 13 so as to correspond to the exemplary configuration of FIG. 2; however, as described in the first embodiment, also in a power semiconductor module in which pairs of semiconductor switching elements 12 and reflux diodes 13 are connected in parallel, a comparable effect of suppressing the gate oscillation can be obtained by employing the same configurations as those in FIG. 10 to FIG. 30.

Fifth Embodiment

In a fifth embodiment, the following describes an exemplary configuration of upper and lower arms of a power conversion device using the power semiconductor module illustrated in each of the first to fourth embodiments.

Figure 31:
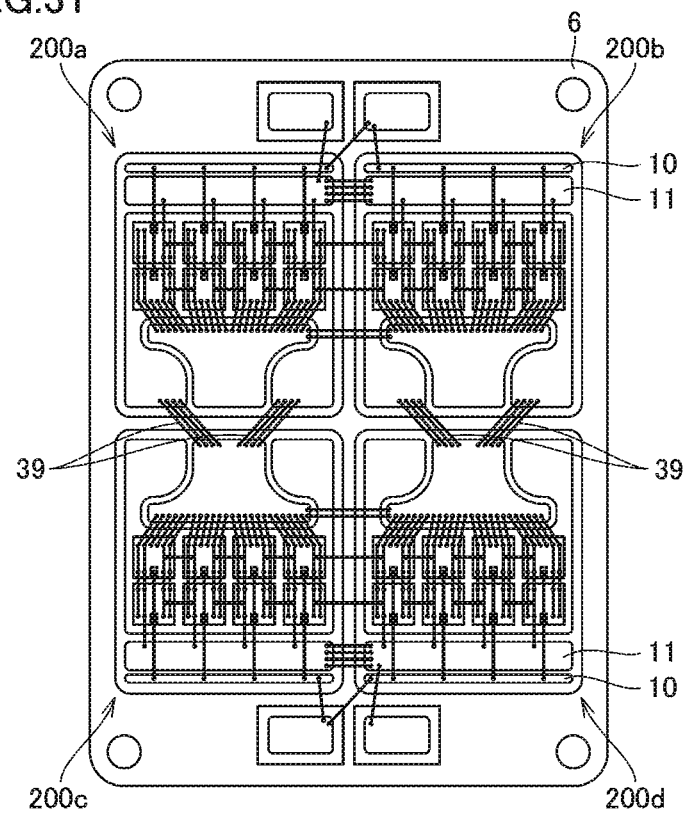
FIG. 31 is a schematic top view of element-mounted substrates for illustrating a first exemplary configuration of a power semiconductor module according to a fifth embodiment.
Figure 32:
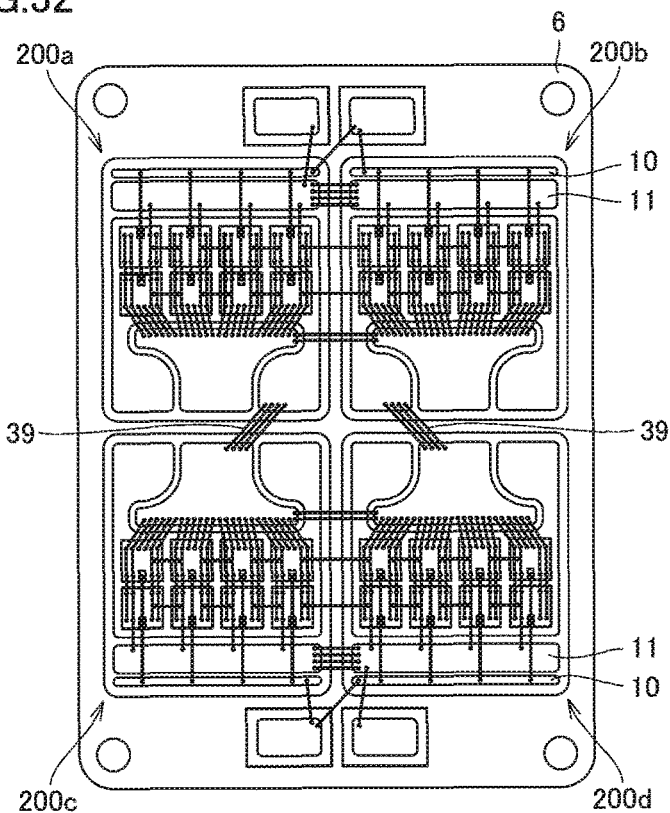
FIG. 32 is a schematic top view of element-mounted substrates for illustrating a second exemplary configuration of the power semiconductor module according to the fifth embodiment.

FIG. 31 and FIG. 32 are schematic top views of element-mounted substrates for illustrating first and second exemplary configurations of the power semiconductor module according to the fifth embodiment.

With reference to FIG. 31, the power semiconductor module according to the fifth embodiment includes element-mounted substrates 200a to 200d. Element-mounted substrates 200a, 200h are connected in parallel in accordance with the same configuration as that of FIG. 28. Therefore, the plurality of semiconductor switching elements 12 mounted on element-mounted substrates 200a, 200b operate in parallel.

Element-mounted substrates 200c, 200d corresponds to element-mounted substrates disposed by rotating, by 180°, element-mounted substrates 200a, 200b connected in parallel. Therefore, the plurality of semiconductor switching elements 12 mounted on element-mounted substrates 200c, 200d also operate in parallel.

Drain pattern 8 of element-mounted substrate 200a and source pattern 9 of element-mounted substrate 200c are electrically connected to each other by upper-lower arm pattern connecting wires 39, and drain pattern 8 of element-mounted substrate 200b and source pattern 9 of element-mounted substrate 200d are electrically connected to each other by upper-lower arm pattern connecting wires 39.

Accordingly, the plurality of semiconductor switching elements 12 that are mounted on element-mounted substrates 200a, 200b and that operate in parallel and the plurality of semiconductor switching elements 12 that are mounted on element-mounted substrates 200c, 200d and that operate in parallel are connected in series. As a result, power semiconductor module 100 can be employed to form the upper and lower arms of the power conversion device such as a converter or an inverter. Specifically, the upper arm can be constituted of the plurality of semiconductor switching elements 12 that are mounted on element-mounted substrates 200c, 200d and that operate in parallel, and the lower arm can be constituted of the plurality of semiconductor switching elements 12 that are mounted on element-mounted substrates 200a, 200b and that operate in parallel.

It should be noted that also when upper-lower arm pattern connecting wires 39 are provided between only part of the plurality of drain patterns 8 of element-mounted substrates 200c, 200d corresponding to the upper arm and source patterns 9 of element-mounted substrates 200a, 200b corresponding to the lower arm as in the exemplary configuration of FIG. 32, the upper and lower arms can be formed in the same manner as in the exemplary configuration of FIG. 31. That is, irrespective of the number of upper-lower arm pattern connecting wires 39, the upper and lower arms of the power conversion device can be formed by the power semiconductor module by electrically connecting drain patterns 8 and source patterns 9 between the plurality of element-mounted substrates 200 included in the same power semiconductor module.

Thus, according to the power semiconductor module of the fifth embodiment, it is possible to reduce or suppress the gate oscillation of the plurality of semiconductor switching elements 12 that operate as the upper arm and the lower arm and that are connected in parallel. Accordingly, the operation of the power conversion device can be stabilized.

Figure 33:
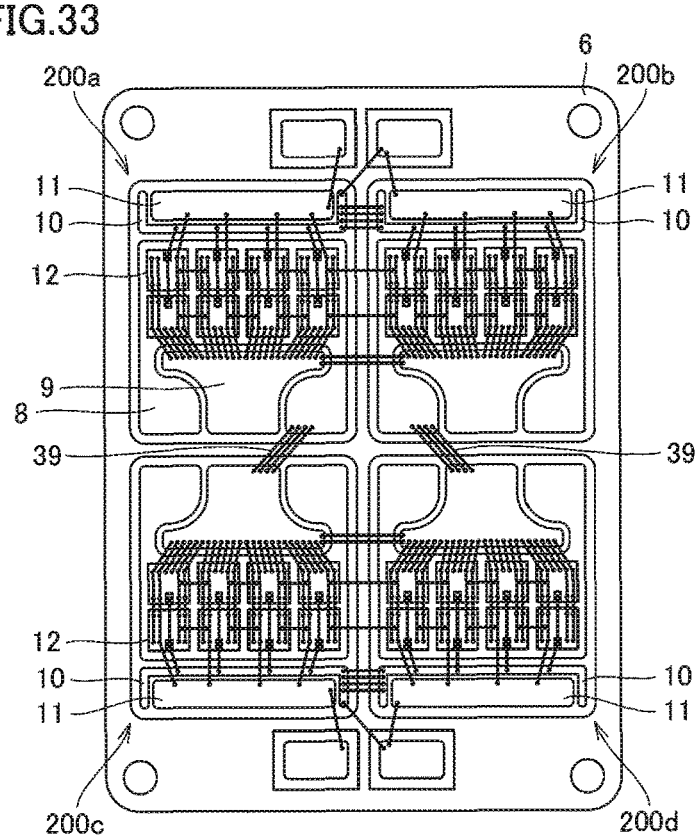
FIG. 33 is a schematic top view of element-mounted substrates for illustrating a modification of the configuration of FIG. 32.

FIG. 33 shows a modification of the configuration of FIG. 32. The modification of FIG. 33 is different from FIG. 32 in that the location of each gate control pattern 10 and the location of each source control pattern 11 are replaced with each other.

Specifically, in the modification of FIG. 33, source control pattern 11 is disposed to interpose gate control pattern 10 between source control pattern 11 and each semiconductor switching element 12. That is, source control pattern 11 is disposed further away from semiconductor switching elements 12 relative to gate control pattern 10.

Also with such a configuration, by way of a combination of at least parts of the reduced width of gate control pattern 10 (the second embodiment), the increased inductance between the gate pads (the third embodiment), and the reduced inductance between the source pads (the fourth embodiment), the wiring inductance of the path between the gate pads of the semiconductor switching elements connected in parallel can be made larger than the wiring inductance between the source pads of the semiconductor switching elements connected in parallel, with the result that the gate oscillation can be reduced or suppressed.

It should be noted that in each of the second to fourth embodiments, the description above is mainly directed to the exemplary configurations in each of which gate control pattern 10 is disposed further away from the semiconductor switching elements relative to source control pattern 11 as with the first embodiment. However, in each of these embodiments, modifications can be employed in each of which source control pattern 11 is disposed further away from the semiconductor switching elements relative to gate control pattern 10 as with FIG. 33. Also in these modifications, the gate oscillation can be reduced or suppressed in the same manner when the wiring inductance of the path between the gate pads can be made larger than the wiring inductance between the source pads by applying the configuration described in each of the embodiments.

Figure 34:
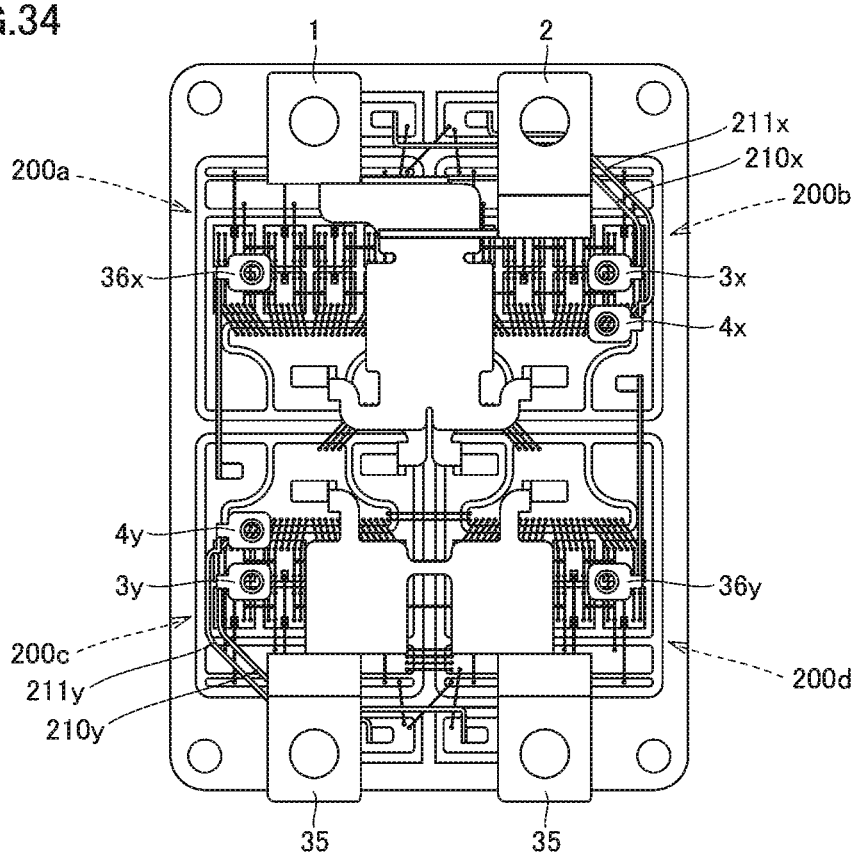
FIG. 34 is a schematic top view of element-mounted substrates for illustrating a third exemplary configuration of the power semiconductor module according to the fifth embodiment.

FIG. 34 is a schematic top view of element-mounted substrates for illustrating a third exemplary configuration of the power semiconductor module according to the fifth embodiment.

In the exemplary configuration of FIG. 34, drain electrode 1, source electrode 2 and output electrodes 35, source control electrodes 3x, 3y, gate control electrodes 4x, 4y, and drain sense electrodes 36x, 36y, which are also shown in FIG. 3 and FIG. 4, are further provided to the exemplary configuration of FIG. 32.

For example, output electrodes 35 are electrically connected to source patterns 9 of element-mounted substrates 200c, 200d corresponding to the upper arm, are electrically connected to drain patterns 8 of element-mounted substrates 200a, 200h corresponding to the lower arm, and are electrically connected to upper-lower arm pattern connecting wires 39 (FIG. 31, FIG. 32). Further, drain electrode 1 is electrically connected to drain patterns 8 of element-mounted substrates 200c, 200d corresponding to the upper arm. Moreover, source electrode 2 is electrically connected to source patterns 9 of element-mounted substrates 200a, 200h corresponding to the lower arm. Further, drain electrode 1, source electrode 2, and output electrodes 35 can be electrically connected to a positive electrode bus bar (not shown), a negative electrode bus bar (not shown), and an output bus bar (not shown) of the power conversion device.

Source control electrode 3x is electrically connected to source control patterns 11 of element-mounted substrates 200a and 200b, and source control electrode 3y is electrically connected to source patterns 9 of element-mounted substrates 200c and 200d. Gate control electrode 4x is electrically connected to gate control patterns 10 of element-mounted substrates 200a and 200b, and gate control electrode 4y is electrically connected to gate control patterns 10 of element-mounted substrates 200c and 200d. Similarly, drain sense electrode 36x is electrically connected to drain patterns 8 of element-mounted substrates 200a and 200b, and drain sense electrode 36y is electrically connected to drain patterns 8 of element-mounted substrates 200c and 200d.

In the exemplary configuration of FIG. 34, by connecting source electrode 2 and output electrodes 35 between element-mounted substrates 200 connected in parallel, the wiring inductance between the sources of semiconductor switching elements 12 of element-mounted substrates 200 is reduced, whereby the gate oscillation can be suppressed.

Moreover, since source control electrode 3x and gate control electrode 4x are disposed in parallel and a wiring 210x for electrically connecting source control electrode 3x to source control pattern 11 and a wiring 211x for electrically connecting gate control electrode 4x to gate control pattern 10 are disposed in parallel, voltage oscillation due to electromagnetic induction caused by oscillation of main circuit current is suppressed from affecting the gate voltage (potential difference between the source and the gate) of each semiconductor switching element 12. Accordingly, when the gate oscillation occurs, the gate oscillation can be suppressed from being amplified by positive feedback by induced voltage resulting from the oscillation of the main circuit current. Similarly, since source control electrode 3y and gate control electrode 4y are disposed in parallel and a wiring 210y for electrically connecting source control electrode 3y to source control pattern 11 and a wiring 211y for electrically connecting gate control electrode 4y to gate control pattern 10 are disposed in parallel, the gate oscillation can be suppressed from being amplified.

It should be noted that also in the configuration of FIG. 34, as long as the wiring inductance of the path between the gate pads can be larger than the wiring inductance between the source pads, the following modification can be employed: source control pattern 11 is disposed further away from the semiconductor switching elements relative to gate control pattern 10 as in FIG. 32.

Sixth Embodiment

In each of the third to fifth embodiments, it has been illustratively described that the power semiconductor module is formed using the plurality of element-mounted substrates (insulating substrates). Particularly in the fifth embodiment, the exemplary configuration of the so-called 2-in-1 module has been described in which the upper and lower arms of the power conversion device are formed using the plurality of semiconductor switching elements mounted on the plurality of insulating substrates. On the other hand, in a sixth embodiment, the following describes an exemplary configuration in which the plurality of semiconductor switching elements for the upper and lower arms are mounted on one insulating substrate.

Main reasons for mounting the semiconductor switching elements on the plurality of insulating substrates as in each of the third to fifth embodiments are reduction of cost and reduction of a defective ratio. Specifically, when a single insulating substrate is used, the insulating substrate is increased in size, with the result that the following disadvantages are concerned. First, it is concerned that with the increased size of the insulating substrate, the substrate is likely to be broken due to warpage of the insulating substrate and stress concentration, thus resulting in increased cost due to an increased defective ratio, i.e., deceased yield. Second, it is concerned that when the insulating substrate is joined to a base plate using, normally, a solder, due to an influence of the increased size of the insulating substrate, not all the air bubbles in the solder are removed at the central portion of the insulating substrate to form voids to thereby cause increased thermal resistance, thus resulting in decreased cooling performance of the semiconductor switching element. Therefore, by forming the power semiconductor module using the plurality of element-mounted substrates (insulating substrates) to avoid the increased size of each insulating substrate as described in the third to fifth embodiments, the above-described disadvantages can be avoided and reduced cost and improved heat radiation performance can be attained.

Meanwhile, in recent years, a so-called insulating substrate integrated type base plate has been developed in which an insulating substrate is directly joined to a base plate without using a joining material such as a solder for the base plate. When this base plate is used, the insulating substrate is increased in size, with the result that patterns on the insulating substrate are formed in a simplified manner. Moreover, by employing an insulating substrate shape for avoiding stress concentration or by increasing the thickness of the insulating substrate in view of thermal resistance decreased due to absence of the solder layer between the insulating substrate and the base plate, the risk of breakage of the substrate can be decreased, thereby attaining a decreased defective ratio. Further, with the direct joining without the use of the solder, no voids are generated due to unremoved air bubbles in the solder. Hence, there is also no risk of increased thermal resistance.

Also in the semiconductor module using the insulating substrate integrated type base plate having such advantages, the gate oscillation can be suppressed by providing the patterns and the wires described in the first to fifth embodiments.

Figure 35:
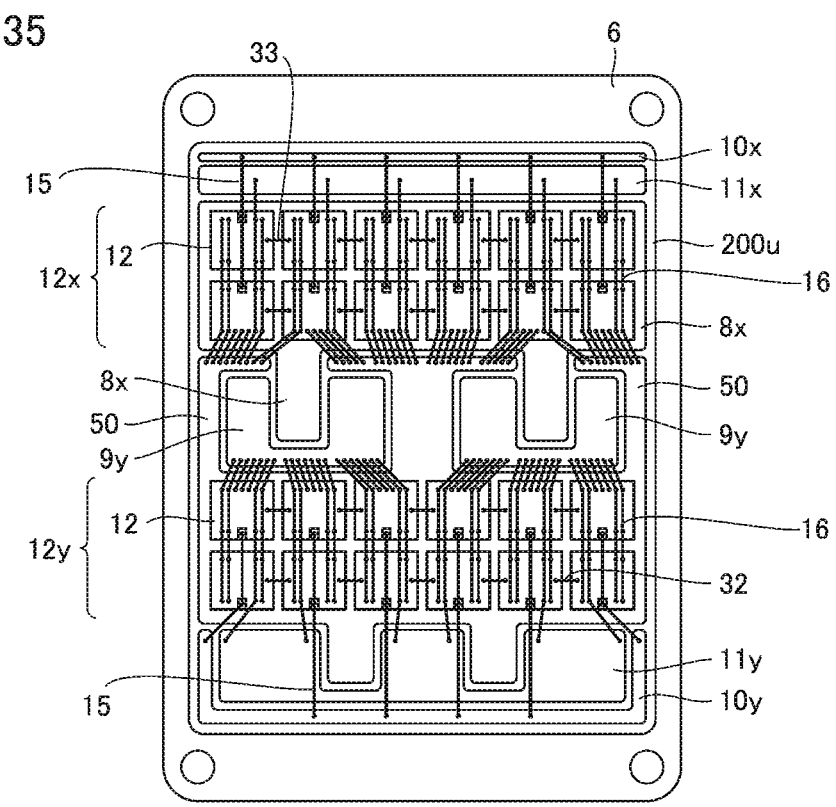
FIG. 35 is a schematic top view for illustrating a first exemplary configuration of a power semiconductor module according to a sixth embodiment.

FIG. 35 is a schematic top view for illustrating a first exemplary configuration of the power semiconductor module according to the sixth embodiment.

With reference to FIG. 35, the semiconductor module according to the sixth embodiment has the plurality of semiconductor switching elements 12 mounted on a single element-mounted substrate 200u. The semiconductor module according to the sixth embodiment can be representatively formed using the above-described insulating substrate integrated type base plate. That is, element-mounted substrate 200u is directly joined to base plate 6 without using a joining material such as solder. The plurality of semiconductor switching elements 12 are classified into: a plurality of semiconductor switching elements 12x for an upper arm; and a plurality of semiconductor switching elements 12y for a lower arm.

A gate control pattern 10x and a source control pattern 11x are provided to be common to the plurality of semiconductor switching elements 12x. Gate control pattern 10x and source control pattern 11x correspond to patterns formed continuously on the same substrate instead of the connections by gate control pattern connecting wire 37 and source control pattern connecting wire 38 in the exemplary configuration of FIG. 20. Therefore, by increasing the inductance between the gate pads to be larger than the inductance between the source pads as described in the first exemplary configuration of the second embodiment, the gate oscillation can be reduced and suppressed between semiconductor switching elements 12x that operate in parallel.

Similarly, a gate control pattern 10y and a source control pattern 11y are provided to be common to the plurality of semiconductor switching elements 12y. Gate control pattern 10y is provided to have a shape with a width smaller than that of source control pattern 11y, and is disposed further away from each of semiconductor switching elements 12y relative to source control pattern 11y. As a result, the inductance between the gate pads is made larger than the inductance between the source pads of semiconductor switching elements 12x that operate in parallel, whereby the gate oscillation can be reduced and suppressed.

Further, as with the illustration of FIG. 23 (the fourth embodiment), for each of semiconductor switching elements 12x, 12y, the number of source control wires 16 is larger than the number of gate control wires 15. Accordingly, the variation in the source potentials of the semiconductor switching elements connected in parallel is reduced, whereby the oscillation is less likely to be induced. Hence, the gate oscillation can be further reduced or suppressed.

Further, a drain pattern 8x for the upper arm, source patterns 9y for the lower arms, and a connection node pattern 50 are provided on element-mounted substrate 200u. Drain pattern 8x is provided to be common to the plurality of semiconductor switching elements (upper arm) 12x, and is joined to the drain pads (FIG. 6) formed at the element backside surface sides of respective semiconductor switching elements 12x. Source patterns 9y are provided to be common to the plurality of semiconductor switching elements (lower arm) 12y, and are electrically connected to the source pads of respective semiconductor switching element 12y via wires.

Connection node pattern 50 corresponds to a connection node between semiconductor switching elements 12x of the upper arm and semiconductor switching elements 12y of the lower arm, and is electrically connected to output electrode 35 (FIG. 34), for example. Connection node pattern 50 is joined to the drain pads formed at the element backside surface sides of respective semiconductor switching elements (lower arm) 12y, and is electrically connected to the source pads of respective semiconductor switching elements (upper arm) 12x via wires.

According to the power semiconductor module according to the sixth embodiment, as with the power semiconductor module according to the fifth embodiment, the upper arm and lower arm of the power conversion device can be formed using the plurality of semiconductor switching elements 12 mounted on single element-mounted substrate 200u. Further, since the gate oscillation can be reduced or suppressed in the plurality of semiconductor switching elements 12x connected in parallel and in the plurality of semiconductor switching elements 12y connected in parallel, the operation of the power conversion device can be stabilized.

Further, according to the power semiconductor module according to the sixth embodiment, the plurality of insulating substrates are not disposed, whereby distances between semiconductor switching elements 12 are equal to each other. As a result, wires corresponding to source pad connecting wires 32 of FIG. 30 or the like can be shortened. Further, the sources of semiconductor switching elements 12x can be electrically connected to each other and the sources of semiconductor switching elements 12y can be electrically connected to each other even though no source pattern connecting wires 33 (FIG. 30 or the like) are disposed. As a result, the variation in the source potentials is further reduced, whereby the gate oscillation is less likely to be induced. Accordingly, the gate oscillation can be suppressed from being amplified.

In the configuration in which the plurality of insulating substrates are disposed as in the fifth embodiment, it is necessary to secure a distance between the insulating substrates and secure a creepage distance between a substrate end and a pattern in each insulating substrate. Accordingly, an ineffective region becomes comparatively large. On the other hand, in the power semiconductor module according to the sixth embodiment using the insulating substrate integrated type base plate, i.e., single element-mounted substrate 200u, the above-described ineffective region is eliminated, whereby an effective region is increased as compared with that in the configuration using the plurality of insulating substrates. Accordingly, a degree of margin in wiring the gate wiring or the like become high as in the lower arm in the exemplary configuration of FIG. 35. As a result, the inductances of the gate wirings between semiconductor switching elements 12x, 12y can be readily adjusted.

Figure 36:
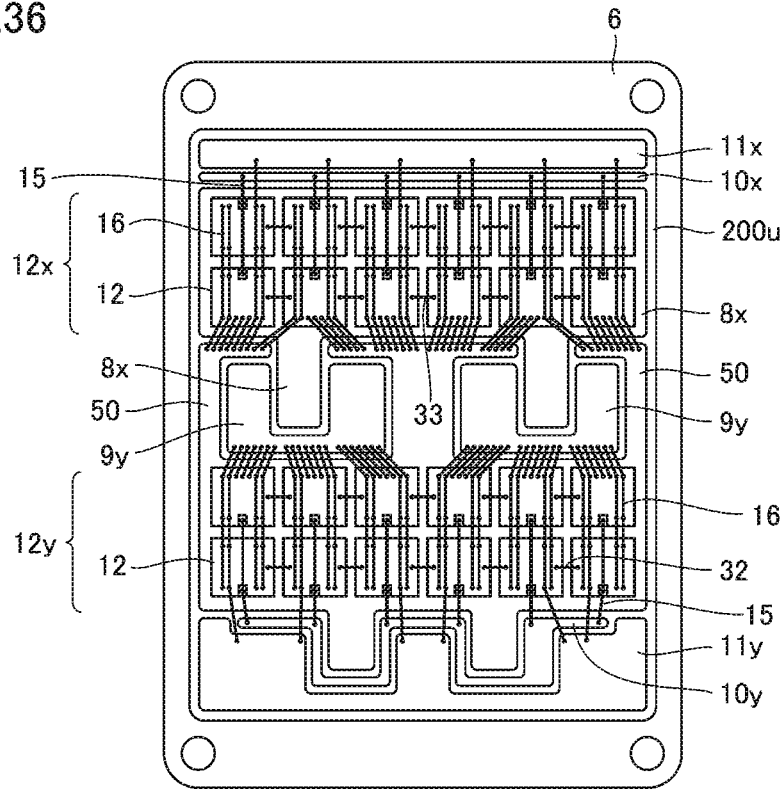
FIG. 36 is a schematic top view for illustrating a second exemplary configuration of the power semiconductor module according to the sixth embodiment.

FIG. 36 is a schematic top view for illustrating a second exemplary configuration of the power semiconductor module according to the sixth embodiment.

The second exemplary configuration shown in FIG. 36 is different from the first exemplary configuration shown in FIG. 35 in that the locations of gate control patterns 10x, 10y are respectively replaced with the locations of source control patterns 11x, 11y.

Specifically, in the configuration of FIG. 36, source control pattern 11x is disposed to interpose gate control pattern 10x between source control pattern 11x and semiconductor switching element 12x and source control pattern 11y is disposed to interpose gate control pattern 10y between source control pattern 11y and semiconductor switching element 12y. That is, source control patterns 11x, 11y are disposed further away from semiconductor switching elements 12x, 12y relative to gate control pattern 10x, 11y, respectively.

Also with such a configuration, by the reduced width of each of gate control patterns 10x, 10y (the second embodiment) as well as the designs of each of gate control wire 15 and source control wire 16 such as the diameter, cross sectional area, and number thereof as described in the first embodiment and the like, the wiring inductance in the path between the gate pads can be made larger than the wiring inductance between the source pads of semiconductor switching elements 12x, 12y connected in parallel. That is, also in the semiconductor module according to the sixth embodiment, source control pattern 11 can be disposed further away from semiconductor switching elements 12 relative to gate control pattern 10. When the wiring inductance in the path between the gate pads can be made larger than the wiring inductance between the source pads by applying the configuration described in each of the embodiments, the gate oscillation can be also reduced or suppressed.

Further, drain electrode 1, source electrode 2, output electrodes 35, source control electrodes 3x, 3y, gate control electrodes 4x, 4y, and drain sense electrodes 36x, 36y, each of which is shown in FIG. 34 (the third exemplary configuration of the fifth embodiment), can be also disposed in the power semiconductor module according to the sixth embodiment. In this case, in the configuration of each of FIG. 35 and FIG. 36, output electrodes 35 are electrically connected to connection node pattern 50, drain electrode 1 is electrically connected to drain pattern 8x of the upper arm, and source electrode 2 is electrically connected to source patterns 9y of the lower arm. Similarly, source control electrode 3x is electrically connected to source control pattern 11x of the upper arm, source control electrode 3y is electrically connected to source control pattern 11y of the lower arm, gate control electrode 4x is electrically connected to gate control pattern 10x of the upper arm, and gate control electrode 4y is electrically connected to gate control pattern 10y of the lower arm. Similarly, drain sense electrode 36x is electrically connected to drain pattern 8x of the upper arm, and drain sense electrode 36y is electrically connected to connection node pattern 50. Accordingly, as with FIG. 34, the wiring inductances between the sources of semiconductor switching elements 12x, 12y can be reduced.

Further, in this case, as with FIG. 34, since source control electrode 3x (3y) and gate control electrode 4x (4y) are disposed in parallel and a wiring for electrically connecting source control electrode 3x (3y) to source control pattern 11x (11y) and a wiring for electrically connecting gate control electrode 4x (4y) to gate control pattern 10x (10y) are disposed in parallel, voltage oscillation due to electromagnetic induction caused by oscillation of main circuit current can be suppressed from affecting the gate voltage (potential difference between the source and the gate) of each semiconductor switching element 12x, 12y.

Seventh Embodiment

In a seventh embodiment, the following describes a power conversion device to which the power semiconductor module according to each of the first to sixth embodiments is applied. The present invention is not limited to a specific power conversion device; however, in the seventh embodiment, the following describes a case where the power semiconductor module according to the present embodiment is applied to a three-phase inverter.

Figure 37:
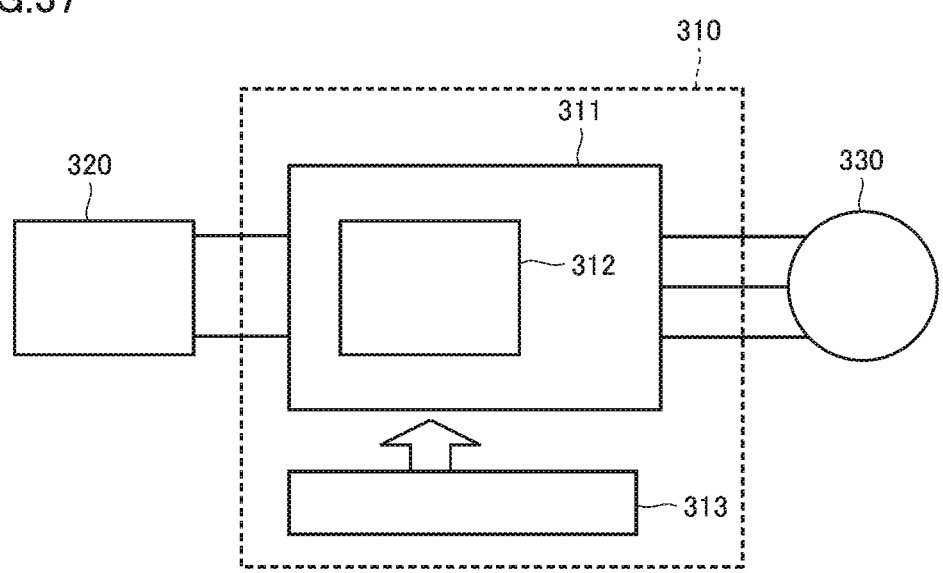
FIG. 37 is a block diagram showing a configuration of a power conversion system to which a power conversion device according to a seventh embodiment is applied.

FIG. 37 is a block diagram showing a configuration of a power conversion system to which the power conversion device according to the seventh embodiment is applied.

With reference to FIG. 37, power conversion system 300 includes a power conversion device 310, a power supply 320, and a load 330. Power supply 320 is a DC power supply, and supplies DC power to power conversion device 310. Power supply 320 can be formed using various components such as a DC system, a solar cell, and a power storage battery. Alternatively, power supply 320 can be formed using a rectifier circuit or AC/DC converter connected to an AC system. Alternatively, power supply 320 can be formed using a DC/DC converter that converts DC power output from a DC system into predetermined power.

Power conversion device 310 is a three-phase inverter connected between power supply 320 and load 330, converts the DC power supplied from power supply 320 into AC power, and supplies the AC power to load 330. Power conversion device 310 includes: a main conversion circuit 311 that converts DC power into AC power and outputs the converted AC power; and a control circuit 313 that outputs a control signal to main conversion circuit 311 so as to control main conversion circuit 311.

Load 330 is a three-phase motor to be driven using the AC power supplied from power conversion device 310. It should be noted that load 330 is not limited to a specific application and is a motor mountable on various types of electric apparatuses. For example, load 330 is used as a motor for hybrid vehicles, electric vehicles, railroad vehicles, elevators, or air conditioners.

Next, details of power conversion device 310 will be described. Main conversion circuit 311 has at least one power semiconductor module 100. Power semiconductor module 100 has a configuration according to each of the first to fifth embodiments or the sixth embodiment.

Main conversion circuit 311 is a two-level, three-phase full bridge circuit, and can be constituted of upper and lower arm elements for the three phases; and six respective reflux diodes connected to the arm elements in anti-parallel.

The upper and lower arm elements for each phase of the three phases are formed using power semiconductor module 100. As known well, in the three-phase inverter, the above-described power conversion between the DC power and the AC power is performed by turning on and off the upper and lower arm elements for each phase. Moreover, the reflux diodes of the three-phase inverter can be constituted of reflux diodes 13 connected in parallel or internal diodes of semiconductor switching elements 12 in power semiconductor module 100. Output terminals of the upper and lower arm elements for the respective phases (U phase, V phase, and W phase) of the full bridge circuit, i.e., three output terminals of main conversion circuit 311 are connected to load 330.

For example, each of the upper and lower arm elements for each phase can be constituted of power semiconductor module 100 according to each of the first to fourth embodiments. Accordingly, the upper or lower arm element can be turned on or off by the parallel operation of the plurality of semiconductor switching elements 12 connected in parallel.

Alternatively, the pair of the upper and lower arm elements for each phase can be constituted of power semiconductor module 100 according to each of the fifth and sixth embodiments. Accordingly, the upper and lower arm elements can be turned on or off by the parallel operation of the plurality of semiconductor switching elements 12 connected in parallel.

In the power conversion system according to the seventh embodiment, by forming power conversion device 310 using the power semiconductor module according to each of the first to sixth embodiments, the gate oscillation in the semiconductor switching elements that operate in parallel can be reduced or suppressed. As a result, the operation of power conversion device 310 can be stabilized and load 330 can be driven stably.

For the purpose of acknowledgement, the following describes such a fact that it has been expected from the time of filing of the application to appropriately combine the configurations described in the above-described plurality of embodiments as long as the combinations, inclusive of combinations not stated in the specification, are not inconsistent or contradictory.

It should be noted that in the above description, each of semiconductor switching elements 12 is a MOSFET (i.e., field effect transistor); however, when semiconductor switching element 12 is an IGBT, the configuration according to each embodiment can be also applied thereto in a similar manner by replacing the drain and the source with a collector and an emitter with regard to the main electrodes. Further, when a bipolar transistor is applied as semiconductor switching element 12, the configuration according to each embodiment can be also applied thereto in a similar manner by replacing the gate as a base with regard to the control electrode.

Moreover, in the present embodiment, the exemplary configurations of the power semiconductor module have been described; however, the gate oscillation can be also reduced or suppressed in a similar manner in each of semiconductor modules for other purposes of use by applying the configuration according to each embodiment, as long as the semiconductor module has such a configuration that a plurality of semiconductor switching elements are connected in parallel and operate in parallel.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: drain electrode; 2: source electrode; 3, 3a, 3b, 3x, 3y: source control electrode; 4, 4a, 4b, 4x, 4y: gate control electrode; 5: housing; 6: base plate; 7, 7a, 7b: insulating substrate; 8: drain pattern; 9: source pattern; 10, 10a, 10b, 28: gate control pattern; 11, 29: source control pattern; 12: semiconductor switching element; 13: reflux diode; 14: source wire; 15, 15a to 15d: gate control wire; 16, 16a to 16d: source control wire; 17: source pad; 18: gate pad; 19: insulating film; 20: drain pad; 21: anode pad; 22: cathode pad; 23, 25: joining material; 24: backside surface pattern; 26: gate resistor; 27, 30, 37: gate control pattern connecting wire; 31, 38: source control pattern connecting wire; 32, 34: source pad connecting wire; 33: source pattern connecting wire; 35: output electrode; 36, 36x, 36y: drain sense electrode; 39: upper-lower arm pattern connecting wire; 40: wiring pattern; 50: connection node pattern; 100: power semiconductor module; 101, 102, 104: electrode; 200, 200a to 200d: element-mounted substrate; 200u: element-mounted substrate (single substrate); 300: power conversion system; 310: power conversion device; 311: main conversion circuit; 313: control circuit; 320: power supply; 330: load; Nc1, Nc2, Ns: node.

The invention claimed is:

1. A semiconductor module having a plurality of semiconductor switching elements that operate in parallel, the semiconductor module comprising:
   an insulating substrate on which the plurality of semiconductor switching elements are mounted, a main electrode control pattern and a control electrode control pattern being provided on the insulating substrate to be common to the plurality of semiconductor switching elements, each of the main electrode control pattern and the control electrode control pattern being electrically connected to a drive circuit for the plurality of semiconductor switching elements;
   respective main electrode pads and respective first wires provided to correspond to the plurality of semiconductor switching elements, the main electrode pads being electrically connected to main electrodes of the semiconductor switching elements, the first wires electrically connecting the main electrode pads to the main electrode control pattern; and
   respective control electrode pads and respective second wires provided to correspond to the plurality of semiconductor switching elements, the control electrode pads being electrically connected to control electrodes of the semiconductor switching elements, the second wires electrically connecting the control electrode pads to the control electrode control pattern, wherein a wiring inductance of a second path formed to extend through the second wires and the control electrode control pattern between the control electrode pads of the plurality of semiconductor switching elements is larger than a wiring inductance of a first path formed to extend through the first wires and the main electrode control pattern between the main electrode pads of the plurality of semiconductor switching elements, and a width of the control electrode control pattern is smaller than a width of the main electrode control pattern.

2. The semiconductor module according to claim 1, wherein on the insulating substrate, the control electrode control pattern is disposed to interpose the main electrode control pattern between the control electrode control pattern and a region in which the plurality of semiconductor switching elements are disposed.

3. The semiconductor module according to claim 1, wherein
the control electrode control pattern is mounted on an insulating substrate different from the insulating substrate on which the semiconductor switching elements and the main electrode pads are mounted, and
the second wires electrically connect the control electrode control pattern mounted on the different insulating substrate to the control electrode pads.

4. The semiconductor module according to claim 1 wherein the width of the control electrode control pattern is smaller than the width of the main electrode control pattern at a location to which the second wires are connected.

5. The semiconductor module according to claim 1, wherein a cross sectional area of each of the second wires is smaller than a cross sectional area of each of the first wires.

6. The semiconductor module according to claim 1, wherein
a plurality of the control electrode control patterns are provided on one or a plurality of the insulating substrates, and
the plurality of the control electrode control patterns are electrically connected to each other by a pattern connecting wire.

7. The semiconductor module according to claim 6, wherein
2n or (2n+1) semiconductor switching elements are provided as the plurality of semiconductor switching elements, where n is a natural number,
the plurality of the control electrode control patterns include
a first control electrode control pattern connected to the control electrode pads of the 2n or (2n+1) semiconductor switching elements by the second wires, and
a second control electrode control pattern connected to the first control electrode control pattern by the pattern connecting wire, and
a first connection location for the pattern connecting wire in the first control electrode control pattern is positioned to provide, from the plurality of semiconductor switching elements, n sets of semiconductor switching elements for which distances between the first connection location and respective second connection locations for the second wires in the first control electrode control pattern are equal to each other.

8. The semiconductor module according to claim 1, wherein the plurality of semiconductor switching elements are distributed and mounted on a plurality of the insulating substrates, the control electrode control pattern and the main electrode control pattern are provided on each of the insulating substrates to be common to the semiconductor switching elements mounted on the each of the insulating substrates, and on the each of the insulating substrates, the first and second wires are provided to correspond to the respective semiconductor switching elements mounted on the each of the insulating substrates, the semiconductor module further comprising:

a third wire that electrically connects the main electrode control patterns to each other between the plurality of the insulating substrates; and a fourth wire that electrically connects the control electrode control patterns to each other between the plurality of the insulating substrates, wherein the plurality of semiconductor switching elements have first and second semiconductor switching elements respectively mounted on first and second insulating substrates of the plurality of insulating substrates, a third path is formed to extend through the first and third wires and the main electrode control patterns of the first and second insulating substrates between the main electrode pads of the first and second semiconductor switching elements, a fourth path is formed to extend through the second and fourth wires and the control electrode control patterns of the first and second insulating substrates between the control electrode pads of the first and second semiconductor switching elements, and a wiring inductance of the fourth path is larger than a wiring inductance of the third path.

9. The semiconductor module according to claim 1, wherein the number of the first wires is larger than the number of the second wires.

10. The semiconductor module according to claim 1, further comprising a fifth wire that directly electrically connects between the main electrode pads of the plurality of semiconductor switching elements.

11. The semiconductor module according to claim 1, wherein each of the second wires is coated with a magnetic substance or is composed of a material including the magnetic substance.

12. The semiconductor module according to claim 1, wherein each of the semiconductor switching elements is composed of a wide band gap semiconductor.

13. A power conversion device comprising:

a main conversion circuit that has the power semiconductor module recited in claim 1 and that converts received power and outputs the converted power, and a control circuit that outputs a control signal to the main conversion circuit so as to control the main conversion circuit.

14. A semiconductor module having a plurality of semiconductor switching elements that operate in parallel, the semiconductor module comprising:

an insulating substrate on which the plurality of semiconductor switching elements are mounted, a main electrode control pattern and a control electrode control pattern being provided on the insulating substrate to be common to the plurality of semiconductor switching elements, each of the main electrode control pattern and the control electrode control pattern being electrically connected to a drive circuit for the plurality of semiconductor switching elements;

respective main electrode pads and respective first wires provided to correspond to the plurality of semiconductor switching elements, the main electrode pads being electrically connected to main electrodes of the semiconductor switching elements, the first wires electrically connecting the main electrode pads to the main electrode control pattern; and respective control electrode pads and respective second wires provided to correspond to the plurality of semiconductor switching elements, the control electrode pads being electrically connected to control electrodes of the semiconductor switching elements, the second wires electrically connecting the control electrode pads to the control electrode control pattern, wherein a wiring inductance of a second path formed to extend through the second wires and the control electrode control pattern between the control electrode pads of the plurality of semiconductor switching elements is larger than a wiring inductance of a first path formed to extend through the first wires and the main electrode control pattern between the main electrode pads of the plurality of semiconductor switching elements, on the insulating substrate, the control electrode control pattern is disposed close to the plurality of semiconductor switching elements relative to the main electrode control pattern, and a width of the control electrode control pattern at least at a location to which the second wires are connected is smaller than a width of the main electrode control pattern.

15. The semiconductor module according to claim 14, wherein a cross sectional area of each of the second wires is smaller than a cross sectional area of each of the first wires.

16. The semiconductor module according to claim 14, wherein a plurality of the control electrode control patterns are provided on one or a plurality of the insulating substrates, and the plurality of the control electrode control patterns are electrically connected to each other by a pattern connecting wire.

17. The semiconductor module according to claim 16, wherein 2n or (2n+1) semiconductor switching elements are provided as the plurality of semiconductor switching elements, where n is a natural number, the plurality of the control electrode control patterns include
a first control electrode control pattern connected to the control electrode pads of the 2n or (2n+1) semiconductor switching elements by the second wires, and
a second control electrode control pattern connected to the first control electrode control pattern by the pattern connecting wire, and a first connection location for the pattern connecting wire in the first control electrode control pattern is positioned to provide, from the plurality of semiconductor switching elements, n sets of semiconductor switching elements for which distances between the first connection location and respective second connection locations for the second wires in the first control electrode control pattern are equal to each other.

18. The semiconductor module according to claim 14, wherein the number of the first wires is larger than the number of the second wires.

19. The semiconductor module according to claim 14, further comprising a fifth wire that directly electrically connects between the main electrode pads of the plurality of semiconductor switching elements.

20. A semiconductor module having a plurality of semiconductor switching elements that operate in parallel, the semiconductor module comprising:

an insulating substrate on which the plurality of semiconductor switching elements are mounted, a main electrode control pattern and a control electrode control pattern being provided on the insulating substrate to be common to the plurality of semiconductor switching elements, each of the main electrode control pattern and the control electrode control pattern being electrically connected to a drive circuit for the plurality of semiconductor switching elements;

respective main electrode pads and respective first wires provided to correspond to the plurality of semiconductor switching elements, the main electrode pads being electrically connected to main electrodes of the semiconductor switching elements, the first wires electrically connecting the main electrode pads to the main electrode control pattern; and respective control electrode pads and respective second wires provided to correspond to the plurality of semiconductor switching elements, the control electrode pads being electrically connected to control electrodes of the semiconductor switching elements, the second wires electrically connecting the control electrode pads to the control electrode control pattern, wherein a wiring inductance of a second path formed to extend through the second wires and the control electrode control pattern between the control electrode pads of the plurality of semiconductor switching elements is larger than a wiring inductance of a first path formed to extend through the first wires and the main electrode control pattern between the main electrode pads of the plurality of semiconductor switching elements, the plurality of semiconductor switching elements are distributed and mounted on a plurality of the insulating substrates, the control electrode control pattern and the main electrode control pattern are provided on each of the insulating substrates to be common to the semiconductor switching elements mounted on the each of the insulating substrates, and on the each of the insulating substrates, the first and second wires are provided to correspond to the respective semiconductor switching elements mounted on the each of the insulating substrates, the semiconductor module further comprising:

a third wire that electrically connects the main electrode control patterns to each other between the plurality of the insulating substrates; and a fourth wire that electrically connects the control electrode control patterns to each other between the plurality of the insulating substrates, wherein the plurality of semiconductor switching elements have first and second semiconductor switching elements respectively mounted on first and second insulating substrates of the plurality of insulating substrates, a third path is formed to extend through the first and third wires and the main electrode control patterns of the first and second insulating substrates between the main electrode pads of the first and second semiconductor switching elements, a fourth path is formed to extend through the second and fourth wires and the control electrode control patterns of the first and second insulating substrates between the control electrode pads of the first and second semiconductor switching elements, and a wiring inductance of the fourth path is larger than a wiring inductance of the third path, and the number of the third wires is larger than the number of the fourth wires.

\* \* \* \* \*